United States Patent
Hirade et al.

(10) Patent No.: US 11,711,932 B2
(45) Date of Patent: Jul. 25, 2023

(54) PHOTOELECTRIC CONVERSION ELEMENT INCLUDING FIRST ELECTRODE, SECOND ELECTRODES, PHOTOELECTRIC CONVERSION FILM, AND CONDUCTIVE LAYER AND METHOD FOR MANUFACTURING THE SAME

(71) Applicant: PANASONIC INTELLECTUAL PROPERTY MANAGEMENT CO., LTD., Osaka (JP)

(72) Inventors: Masaya Hirade, Osaka (JP); Manabu Nakata, Osaka (JP); Katsuya Nozawa, Osaka (JP); Yasunori Inoue, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/313,563

(22) Filed: May 6, 2021

(65) Prior Publication Data
US 2021/0265583 A1     Aug. 26, 2021

Related U.S. Application Data

(62) Division of application No. 16/274,154, filed on Feb. 12, 2019, now Pat. No. 11,031,568.

(30) Foreign Application Priority Data

Feb. 26, 2018    (JP) ................................ 2018-031899

(51) Int. Cl.
*H01L 51/44*      (2006.01)
*H10K 30/82*      (2023.01)
(Continued)

(52) U.S. Cl.
CPC ........... *H10K 30/82* (2023.02); *H10K 30/353* (2023.02); *H10K 39/32* (2023.02); *H10K 71/135* (2023.02);
(Continued)

(58) Field of Classification Search
CPC . H01L 51/442; H01L 27/307; H01L 51/0005; H01L 51/001; H01L 51/0017;
(Continued)

(56) References Cited

U.S. PATENT DOCUMENTS

| 2011/0049591 A1 | 3/2011 | Nakatani et al. |
| 2011/0241151 A1 | 10/2011 | Nakatani et al. |

(Continued)

FOREIGN PATENT DOCUMENTS

| JP | 2003-234460 A | 8/2003 |
| JP | 2006-032714 A | 2/2006 |

(Continued)

OTHER PUBLICATIONS

Notice of Allowance issued in U.S. Appl. No. 16/274,154, dated Feb. 22, 2021.

*Primary Examiner* — Mohammed R Alam
(74) *Attorney, Agent, or Firm* — McDermott Will & Emery LLP

(57) ABSTRACT

A method for manufacturing a photoelectric conversion element includes providing a base structure including a semiconductor substrate having a principal surface, a first electrode located on or above the principal surface, second electrodes which are located on or above the principal surface and which are one- or two-dimensionally arranged, and a photoelectric conversion film covering at least the second electrodes; forming a mask layer on the photoelectric conversion film, the mask layer being conductive and including a covering section covering a portion of the (Continued)

photoelectric conversion film that overlaps the second electrodes in plan view; and partially removing the photoelectric conversion film by immersing the base structure and the mask layer in an etchant.

14 Claims, 14 Drawing Sheets

(51) Int. Cl.
  *H10K 30/30* (2023.01)
  *H10K 39/32* (2023.01)
  *H10K 71/13* (2023.01)
  *H10K 71/16* (2023.01)
  *H10K 71/20* (2023.01)

(52) U.S. Cl.
  CPC ......... *H10K 71/164* (2023.02); *H10K 71/231* (2023.02)

(58) Field of Classification Search
  CPC ... H01L 51/4273; H01L 51/441; H01L 51/56; H01L 51/0021; H01L 51/424; H01L 51/4253; Y02E 10/549; Y02P 70/50
  See application file for complete search history.

(56) References Cited

U.S. PATENT DOCUMENTS

| | | |
|---|---|---|
| 2012/0204960 A1 | 8/2012 | Kato et al. |
| 2015/0001503 A1 | 1/2015 | Hirose |
| 2015/0070556 A1 | 3/2015 | Joei et al. |
| 2015/0194469 A1* | 7/2015 | Joei ................... H01L 27/14636 438/73 |
| 2015/0311259 A1* | 10/2015 | Joei ........................ H04N 5/376 257/40 |
| 2016/0043144 A1* | 2/2016 | Sato .................. H01L 27/14601 257/40 |
| 2016/0190188 A1 | 6/2016 | Murakami et al. |
| 2016/0246415 A1 | 8/2016 | Bae et al. |
| 2017/0205917 A1 | 7/2017 | Yamaoka et al. |
| 2017/0220161 A1 | 8/2017 | Lee et al. |
| 2017/0294485 A1* | 10/2017 | Joei ........................ H01L 31/10 |

FOREIGN PATENT DOCUMENTS

| | | |
|---|---|---|
| JP | 2010-098249 A | 4/2010 |
| JP | 2011-071481 A | 4/2011 |
| JP | 2011-119694 A | 6/2011 |
| JP | 2011-228648 A | 11/2011 |
| JP | 2014-060315 A | 4/2014 |
| JP | 2015-012239 A | 1/2015 |
| JP | 2015-056554 A | 3/2015 |
| JP | 2017-046333 A | 3/2017 |

* cited by examiner

US 11,711,932 B2

PHOTOELECTRIC CONVERSION ELEMENT INCLUDING FIRST ELECTRODE, SECOND ELECTRODES, PHOTOELECTRIC CONVERSION FILM, AND CONDUCTIVE LAYER AND METHOD FOR MANUFACTURING THE SAME

CROSS-REFERENCE OF RELATED APPLICATIONS

This application is a Divisional application of U.S. patent application Ser. No. 16/274,154, filed on Feb. 12, 2019, which in turn claims the benefit of Japanese Application No. 2018-031899, filed on Feb. 26, 2018, the entire disclosures of which Applications are incorporated by reference herein.

BACKGROUND

1. Technical Field

The present disclosure relates to a photoelectric conversion element including a first electrode, second electrodes, a photoelectric conversion film, and a conductive layer and a method for manufacturing the photoelectric conversion element.

2. Description of the Related Art

Known imaging devices include a semiconductor substrate and a photoelectric conversion section placed on or above the semiconductor substrate. Such a configuration is called a stack-type configuration. For example, Japanese Unexamined Patent Application Publication Nos. 2006-032714, 2011-228648, 2015-056554, and 2003-234460 disclose an imaging device including a semiconductor substrate and a photoelectric conversion film placed on or above the semiconductor substrate.

In the stack-type configuration, a semiconductor substrate supporting a photoelectric conversion section is provided with a charge-coupled device (CCD) circuit or complementary metal oxide semiconductor (CMOS) circuit for reading out signals. According to the stack-type configuration, a section performing photoelectric conversion is located on or above the semiconductor substrate and therefore a high aperture ratio is readily obtained. Furthermore, an advantage in being sensitive in the near-infrared region, in which Si exhibits no absorption, is obtained.

An organic material is typically used as material for forming a photoelectric conversion film. Japanese Unexamined Patent Application Publication No. 2006-032714 discloses a method for patterning an organic material layer that is a photoelectric conversion film by dry etching. Japanese Unexamined Patent Application Publication Nos. 2011-228648 and 2015-056554 propose the suppression of a white defect by reducing the stress applied to an organic photoelectric conversion film. The term "white defect" as used herein refers to a phenomenon in which a bright portion like a white flaw is caused in an image because a photoelectric conversion film is damaged by a factor such as the local concentration of stress and a dark current is generated in a damaged portion.

SUMMARY

In one general aspect, the techniques disclosed here feature a method for manufacturing a photoelectric conversion element. The method includes providing a base structure including a semiconductor substrate having a principal surface, a first electrode located on or above the principal surface, second electrodes which are located on or above the principal surface and which are one- or two-dimensionally arranged, and a photoelectric conversion film covering at least the second electrodes; forming a mask layer on the photoelectric conversion film, the mask layer being conductive and including a covering section covering a portion of the photoelectric conversion film that overlaps the second electrodes in plan view; and partially removing the photoelectric conversion film by immersing the base structure and the mask layer in an etchant.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
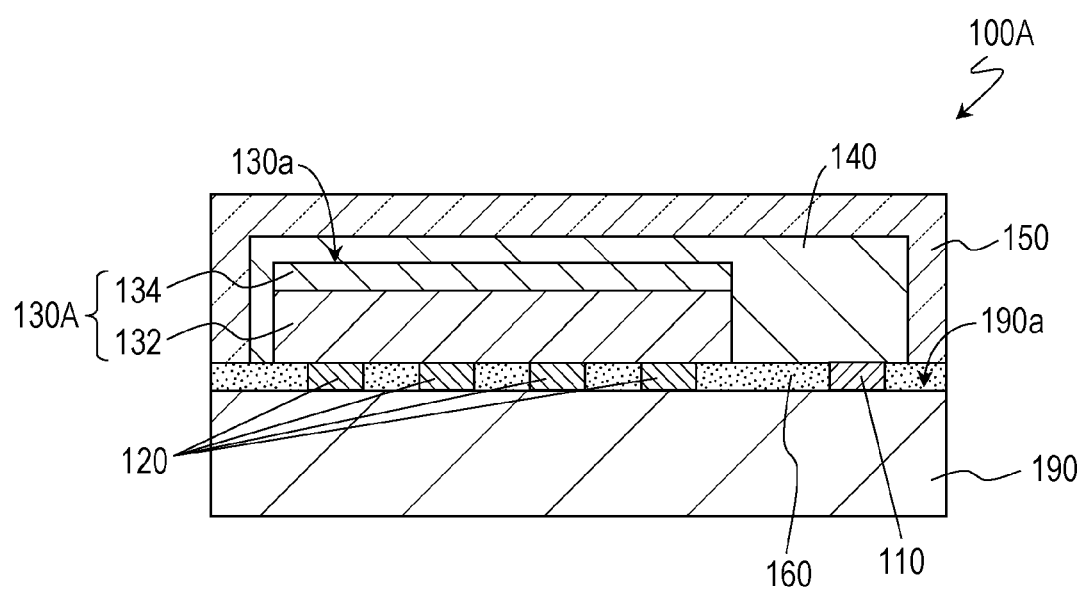
FIG. 1 is a schematic sectional view of an exemplary photoelectric conversion element obtained by a manufacturing method according to an embodiment of the present disclosure.

An aspect of the present disclosure is as summarized below.

Item 1

A method for manufacturing a photoelectric conversion element according to Item 1 of the present disclosure includes providing a base structure including a semiconductor substrate having a principal surface, a first electrode located on or above the principal surface, second electrodes which are located on or above the principal surface and which are one- or two-dimensionally arranged, and a photoelectric conversion film covering at least the second electrodes;

forming a mask layer on the photoelectric conversion film, the mask layer being conductive and including a covering section covering a portion of the photoelectric conversion film that overlaps the second electrodes in plan view; and partially removing the photoelectric conversion film by immersing the base structure and the mask layer in an etchant.

According to a configuration specified in Item 1, since the photoelectric conversion film is partially removed by wet etching, the stress in the photoelectric conversion film is reduced and the effect of suppressing the occurrence of a white defect is obtained. Furthermore, since the mask layer, which is conductive, is used for wet etching, a portion of the mask layer that remains after etching can be used as, for example, a charge-blocking layer or a light-transmissive electrode.

Item 2

In the method for manufacturing the photoelectric conversion element according to Item 1, the mask layer may be made of an organic material, and an etching rate of the mask layer during partially removing the photoelectric conversion film may be lower than an etching rate of the photoelectric conversion film during partially removing the photoelectric conversion film.

According to a configuration specified in Item 2, the photoelectric conversion film can be preferentially dissolved during wet etching and therefore the mask layer can be left on the photoelectric conversion film after wet etching, whereas the organic material is used to form the mask layer.

Item 3

In the method for manufacturing the photoelectric conversion element according to Item 2, the organic material may be a photoelectric conversion material.

According to a configuration specified in Item 3, a portion of the covering section that remains after etching, the covering section being a portion of the mask layer, can be used as a portion of a photoelectric conversion structure, for example, a charge-blocking layer.

Item 4

In the method for manufacturing the photoelectric conversion element according to Item 1, the mask layer may be made of an oxide semiconductor material.

According to a configuration specified in Item 4, a portion of the covering section that remains after etching, the covering section being a portion of the mask layer, can be used as a portion of a photoelectric conversion structure, for example, a charge-blocking layer and the following advantage is obtained: an advantage that the photoelectric conversion efficiency is increased by applying a higher voltage to an organic photoelectric conversion film.

Item 5

The method for manufacturing the photoelectric conversion element according to any one of Items 2 to 4 may further include forming a light-transmissive third electrode which covers the covering section and which electrically connects the covering section to the first electrode after partially removing the photoelectric conversion film.

According to a configuration specified in Item 5, the covering section can be used as a light-transmissive counter electrode.

Item 6

In the method for manufacturing the photoelectric conversion element according to Item 1, the mask layer may be made of a transparent conductive material.

According to a configuration specified in Item 6, the covering section, which is a portion of the mask layer, can be used as a light-transmissive electrode.

Item 7

The method for manufacturing the photoelectric conversion element according to Item 6 may further include forming a third electrode electrically connecting the covering section to the first electrode after partially removing the photoelectric conversion film.

According to a configuration specified in Item 7, a counter electrode can be formed so as to include a portion of the covering section.

Item 8

In the method for manufacturing the photoelectric conversion element according to any one of Items 1 to 7, the base structure may include a readout circuit electrically connected to the second electrodes.

Item 9

In the method for manufacturing the photoelectric conversion element according to any one of Items 1 to 8, the step of providing the base structure may include forming the second electrodes on or above the principal surface and forming the photoelectric conversion film on or above the principal surface after forming the second electrodes.

Item 10

A photoelectric conversion element according to Item 10 of the present disclosure includes a semiconductor substrate having a principal surface, a first electrode located on or above the principal surface, second electrodes which are located on or above the principal surface and which are one- or two-dimensionally arranged, a photoelectric conversion film covering at least the second electrodes, and a conductive layer covering a portion of the photoelectric conversion film, the portion overlapping the second electrodes in plan view.

In a cross section perpendicular to the principal surface, the conductive layer extends outside a side end portion of the photoelectric conversion film.

Item 11

In the photoelectric conversion element according to Item 10, in the cross section, the photoelectric conversion film may have a tapered side surface.

Item 12

In the photoelectric conversion element according to Item 10, the conductive layer may be made of an organic material.

Item 13

In the photoelectric conversion element according to Item 12, the organic material may be a photoelectric conversion material.

Item 14

In the photoelectric conversion element according to Item 10, the conductive layer may be made of an oxide semiconductor material.

Item 15

The photoelectric conversion element according to any one of Items 12 to 14 may further include a light-transmissive third electrode which covers the covering section and which electrically connects the covering section to the first electrode.

Item 16

In the photoelectric conversion element according to Item 10, the conductive layer may be made of a transparent conductive material.

Item 17

The photoelectric conversion element according to Item 16 may further include a third electrode electrically connecting the covering section to the first electrode.

Item 18

In the photoelectric conversion element according to any one of Items 10 to 17, the semiconductor substrate may include at least a part of a readout circuit electrically connected to the second electrodes.

Embodiments of the present disclosure are described below in detail with reference to the accompanying drawings. Each of the embodiments described below illustrates a general or specific example. Numerical values, shapes, materials, structural components, the arrangement and connection of the structural components, steps, the order of the steps, and the like described above in the embodiments are merely examples and are not intended to limit the present disclosure. Various aspects described herein can be combined with each other unless a contradiction arises. Among the structural components in the embodiments, structural components that are not recited in an independent claim indicating the highest concept are described as arbitrary structural components. In descriptions below, structural components having substantially the same function are represented by common reference numerals and are not described in detail in some cases.

FIG. 1 schematically shows a cross section of an exemplary photoelectric conversion element 100A obtained by a manufacturing method according to an embodiment of the present disclosure. As shown in FIG. 1, the photoelectric conversion element 100A roughly includes a semiconductor substrate 190 having a principal surface 190a, a first electrode 110 placed on the principal surface 190a side of the semiconductor substrate 190, a plurality of second electrodes 120 placed on the principal surface 190a side of the semiconductor substrate 190, a photoelectric conversion structure 130A covering the second electrodes 120, and a counter electrode 140 which is light-transmissive and which covers at least the upper surface 130a of the photoelectric conversion structure 130A. The counter electrode 140 is formed from a transparent conductive material typified by indium tin oxide (ITO) and the like. Incidentally, the terms "light-transmissive" and "transparent" as used herein mean that the photoelectric conversion structure 130A transmits at least one portion of light with an absorbable wavelength and does not necessarily mean that the photoelectric conversion structure 130A transmits light in the visible wavelength range. The terms "on or above", "upper surface", and "lower surface" as used herein are used to indicate the relative arrangement of members and are not intended to limit the attitude of a photoelectric conversion element according to the present disclosure.

In FIG. 1, the semiconductor substrate 190, which supports the photoelectric conversion structure 130A, is provided with a driving circuit, which is not shown, for driving the photoelectric conversion element 100A and readout circuits, which are not shown, for reading out a signal depending on the illuminance. The semiconductor substrate 190 is not limited to a substrate entirely made of a semiconductor and may be an insulating substrate provided with a semiconductor layer placed on a surface on the side that the second electrodes 120 are arranged.

As schematically shown in FIG. 1, the counter electrode 140 extends on or above the first electrode 110 and is connected to the first electrode 110. That is, the counter electrode 140 is configured such that a predetermined voltage can be applied to the counter electrode 140 through the first electrode 110 during the operation of the photoelectric conversion element 100A.

The second electrodes 120 are one- or two-dimensionally arranged on or above the principal surface 190a as described below. Each of the second electrodes 120 is connected to a corresponding one of the readout circuits. In an example shown in FIG. 1, the photoelectric conversion element 100A has a configuration similar to that of a stack-type of imaging device and can be used as a digital camera, a light sensor, or the like.

In this example, the photoelectric conversion structure 130A includes a photoelectric conversion layer 132 covering the second electrodes 120 and an organic layer 134 placed on the photoelectric conversion layer 132. The organic layer 134 may be, for example, a charge-blocking layer such as a hole-blocking layer or an electron-blocking layer. The organic layer 134 may have a photoelectric conversion function.

In a configuration exemplified in FIG. 1, the photoelectric conversion element 100A further includes a protective layer 150 and an interlayer insulating layer 160. The protective layer 150 is formed from a light-transmissive insulating material and covers the counter electrode 140. The interlayer insulating layer 160 is located between the principal surface 190a and the photoelectric conversion structure 130A. As schematically shown in FIG. 1, the interlayer insulating layer 160 electrically separates the two adjacent second electrodes 120 from each other. Furthermore, the interlayer insulating layer 160 electrically separates the first electrode 110 from the second electrodes 120.

Figure 2:
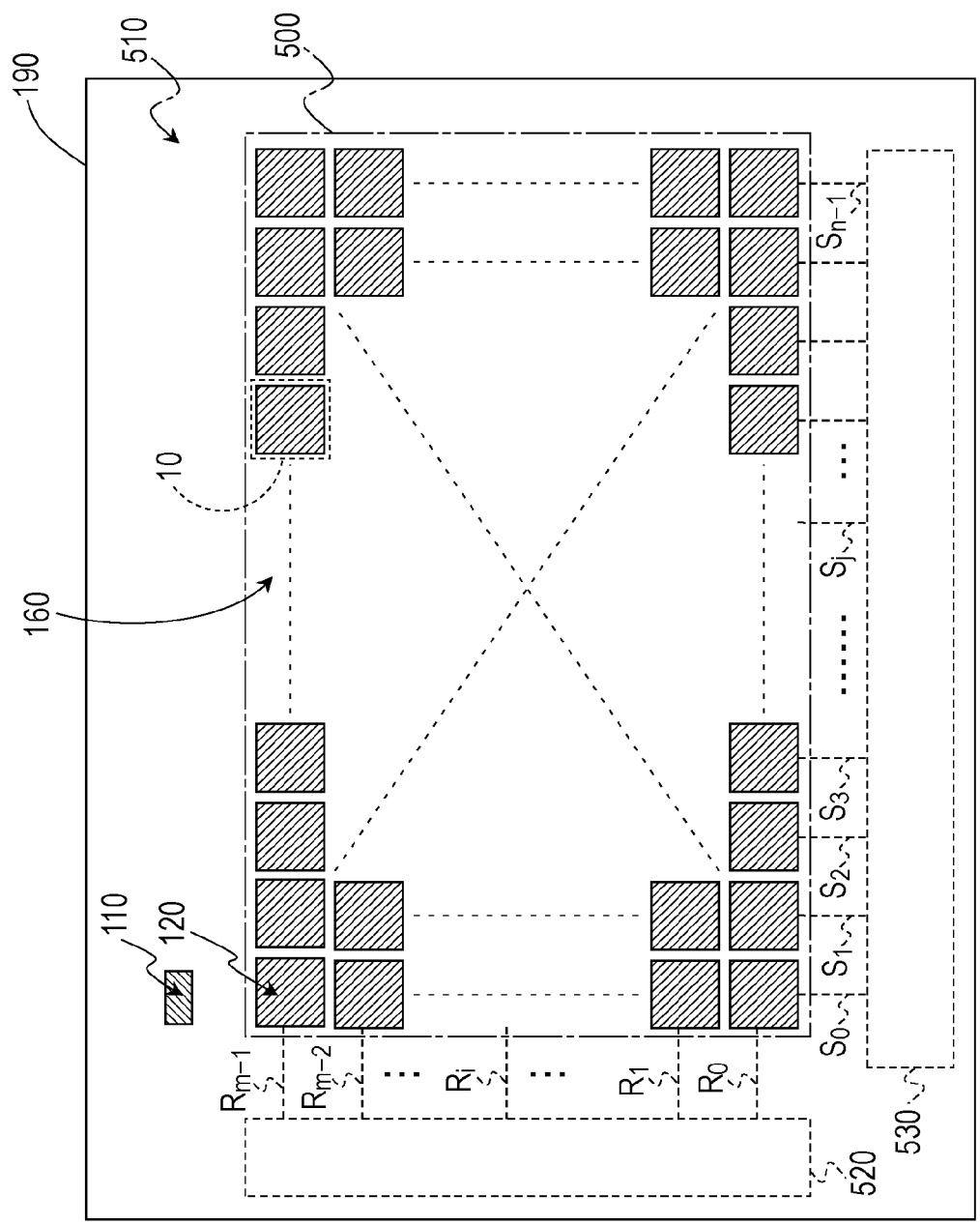
FIG. 2 is a schematic plan view of the photoelectric conversion element shown in FIG. 1 when viewed from the principal surface side of a semiconductor substrate.

FIG. 2 is a schematic plan view of the photoelectric conversion element 100A when viewed from the principal surface 190a side of the semiconductor substrate 190. For convenience of description, FIG. 2 shows a structure excluding the photoelectric conversion structure 130A, the counter electrode 140, and the protective layer 150 from the configuration described with reference to FIG. 1.

As schematically shown in FIG. 2, the photoelectric conversion element 100A includes an imaging region 500 including a plurality of pixels 10. The imaging region 500 may referred to as a region having a repeating structure of the pixels 10, which are units each including a corresponding one of the second electrodes 120 and a corresponding one of the readout circuits, which are connected to the second electrodes 120. In this example, the second electrodes 120 are arranged in a plurality of rows and columns on the principal surface 190a side of the semiconductor substrate 190; hence, the imaging region 500, which is rectangular, is placed on the principal surface 190a side of the semiconductor substrate semiconductor substrate 190. The arrangement of the second electrodes 120 is not limited to such a matrix as exemplified in FIG. 2. For example, the second electrodes 120 may be one-dimensionally arranged such that the photoelectric conversion element 100A is used as a line sensor. The number of the second electrodes 120 is arbitrary.

The first electrode 110 is located in a peripheral region 510 outside the imaging region 500 and is connected to a voltage supply circuit, which is not shown, through a circuit or wiring line formed on the semiconductor substrate semiconductor substrate 190. A predetermined voltage is applied to the first electrode 110 during the operation of the photoelectric conversion element 100A.

As schematically shown in FIG. 2, the photoelectric conversion element 100A includes a plurality of row signal lines $R_0, R_1, \ldots, R_i, \ldots, R_{m-1}$ placed for each row of the pixels 10 and output signal lines $S_0, S_1, \ldots, S_j, \ldots, S_{n-1}$ placed for each column of the pixels 10, where m is an integer of 0 or more and n is an integer of 0 or more. One or more of the pixels 10 belonging to each row are electrically connected to a corresponding one of the row signal lines. One or more of the pixels 10 belonging to each column are electrically connected to a corresponding one of the output signal lines.

The row signal lines $R_0, R_1, \ldots, R_i, \ldots, R_{m-1}$ are, for example, address signal lines. The row signal lines $R_0, R_1, \ldots, R_i, \ldots, R_{m-1}$ extend to a row driver region 520 provided with transistors making up a row-scanning circuit and the like and are connected to, for example, the row-scanning circuit. The output signal lines $S_0, S_1, \ldots, \ldots, S_{n-1}$ extend to a column driver region 530 provided with transistors making up a column-scanning circuit and the like. The output signal lines $S_0, S_1, \ldots, \ldots, S_{n-1}$ can be connected to the column-scanning circuit. The column-scanning circuit executes noise suppression signal processing typified by correlated double sampling, analogue-digital conversion, or the like for output signals read out from the pixels 10.

Figure 3:
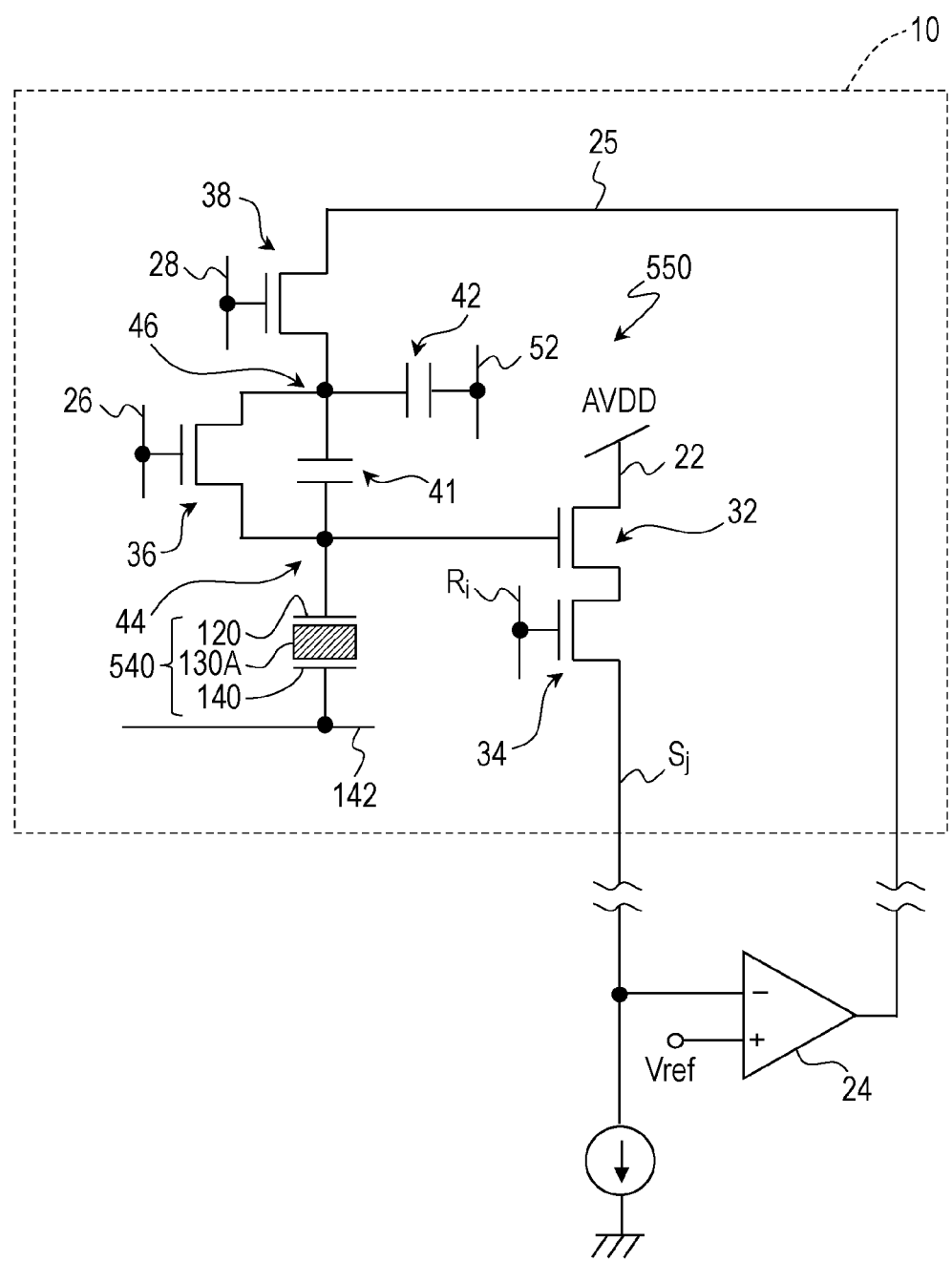
FIG. 3 is a diagram showing the exemplary circuit configuration of a pixel shown in FIG. 2.

FIG. 3 shows the exemplary circuit configuration of each pixel 10. For the sake of ease, one of the pixels 10 that is located at the ith row and the jth column is shown herein.

The pixel 10 shown in FIG. 3 includes a photoelectric conversion section 540 including one of the second electrodes 120, the counter electrode 140, and the photoelectric conversion structure 130A and a readout circuit 550 connected to the second electrode 120. The counter electrode 140 is connected to a wiring line 142 through the first electrode 110, which is not shown in FIG. 3, and is supplied with a predetermined voltage from a voltage supply circuit, which is not shown, during operation. The potential of the counter electrode 140 is adjusted, for example, above the potential of the second electrode 120, which functions as a pixel electrode, in such a manner that a predetermined voltage is applied to the counter electrode 140 through the wiring line 142, thereby enabling, among charges generated in the photoelectric conversion structure 130A by the incidence of light, positive charges to be collected as signal charges by the second electrode 120.

In the configuration shown in FIG. 3, the readout circuit 550 includes a signal detection transistor 32 and an address transistor 34. The signal detection transistor 32 and the address transistor 34 are typically field-effect transistors formed on the semiconductor substrate 190. Examples in which an n-channel MOSFET is used as a transistor are described below.

The gate of the signal detection transistor 32 is connected to the second electrode 120 and the drain thereof is connected to a power line 22 functioning as a source follower power supply. A node 44 between the photoelectric conversion section 540 and the gate of the signal detection transistor 32 forms at least one portion of a charge storage region storing signal charges generated in the photoelectric conversion section 540. The address transistor 34 is connected between the signal detection transistor 32 and the output signal line $S_j$. Turning on the address transistor 34 allows a voltage signal depending on the illuminance is read out in the output signal line $S_j$.

In an example shown in FIG. 3, the readout circuit 550 includes a first reset transistor 36, a second reset transistor 38, a first capacitor 41, and a second capacitor 42. Furthermore, in this example, the photoelectric conversion element 100A includes an inverting amplifier 24 placed for each column of the pixels 10. The inverting amplifier 24 includes an inverting input terminal connected to the output signal line S$_j$. A predetermined reference voltage Vref is applied to the inverting input terminal during operation. As shown in FIG. 3, the first reset transistor 36 ad the second reset transistor 38 are connected in series between the second electrode 120 and a feedback line 25 connected to an output terminal of the inverting amplifier 24.

The first capacitor 41 is connected in parallel to the first reset transistor 36. One of the source and drain of the first reset transistor 36 is connected to the second electrode 120. The second capacitor 42 includes an electrode connected to a node 46 between the first reset transistor 36 and the second reset transistor 38. The second capacitor 42 includes another electrode connected to a storage control line 52. A predetermined voltage is applied to the other electrode of the second capacitor 42 during operation. The second capacitor 42 typically has a capacitance greater than that of the first capacitor 41.

Controlling the potential of a first reset control line 26 connected to the gate of the first reset transistor 36 and the potential of a second reset control line 28 connected to the gate of the second reset transistor 38 enables a feedback loop electrically feeding back some or all of output signals from the signal detection transistor 32 to be formed. Forming the feedback loop enables the influence of the kTC noise caused by turning off the first reset transistor 36 and the second reset transistor 38 to be reduced. Details of such noise canceling using feedback are described in Japanese Unexamined Patent Application Publication No. 2017-046333. According to a circuit configuration exemplified in FIG. 3, the first reset transistor 36 can function as a transistor for gain switching. Details of such mode switching are also described in Japanese Unexamined Patent Application Publication No. 2017-046333.

Figure 4:
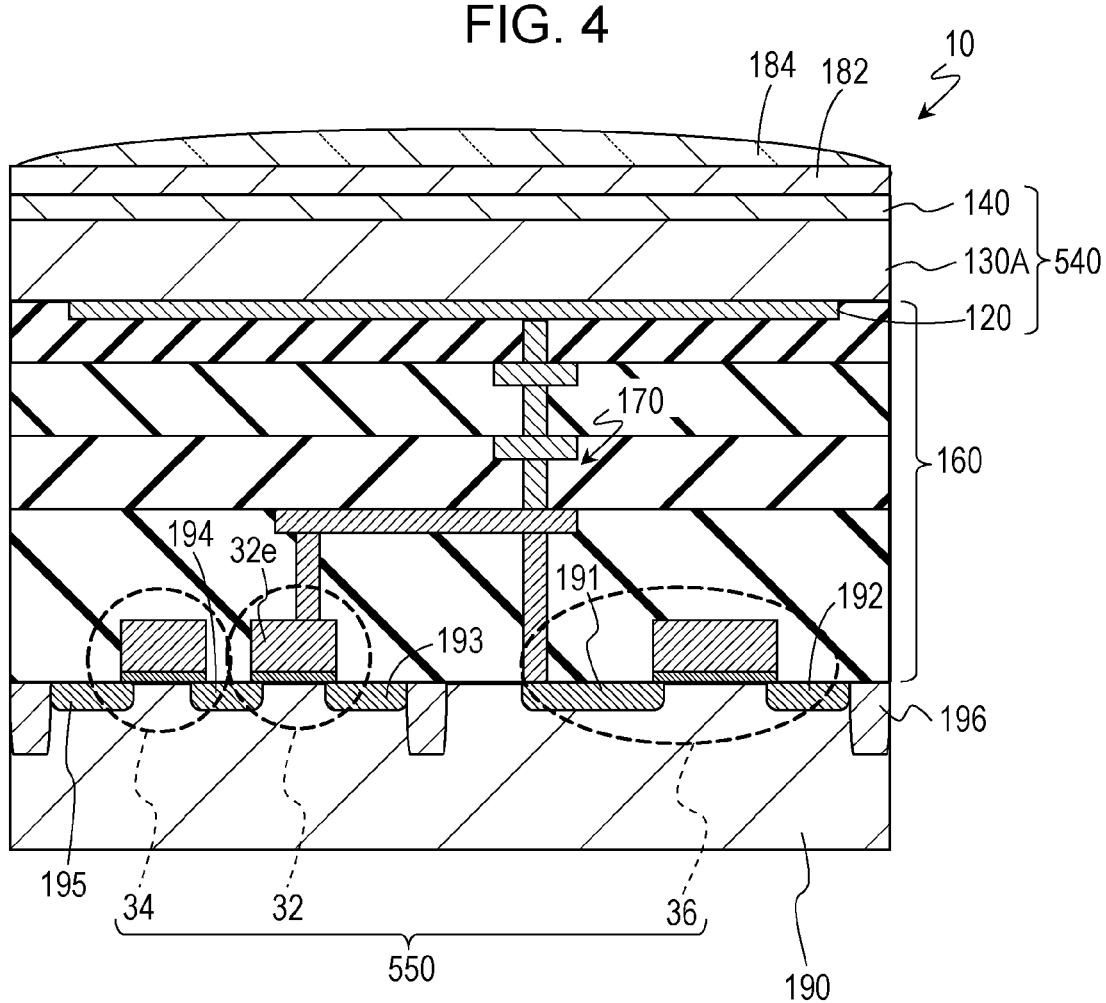
FIG. 4 is a schematic sectional view showing the exemplary device structure of the pixel shown in FIG. 2.

FIG. 4 schematically shows the exemplary device structure of each pixel 10. The semiconductor substrate 190 includes impurity regions 191, 192, 193, 194, and 195 and an isolation region 196 electrically isolating the readout circuits 550, each of which is placed in a corresponding one of the pixels 10, between the pixels 10. The impurity regions 191, 192, 193, 194, and 195 are typically n-type diffusion regions. In FIG. 4, in order to avoid the complication of FIG. 4, the signal detection transistor 32, the address transistor 34, and the first reset transistor 36 are shown on behalf of components making up the readout circuit 550.

The signal detection transistor 32 includes the impurity regions 193 and 194, which are among the impurity regions 191, 192, 193, 194, and 195, and a gate electrode 32e placed above the semiconductor substrate 190 with a gate insulating layer therebetween. The address transistor 34 includes a gate insulating layer placed on the semiconductor substrate 190, a gate electrode, and the impurity regions 194 and 195. In this example, the address transistor 34 shares the impurity region 194 with the signal detection transistor 32.

The first reset transistor 36 includes the impurity regions 191 and 192, a gate insulating layer placed on the semiconductor substrate 190, and a gate electrode. As schematically shown in FIG. 4, the isolation region 196 is placed between the first reset transistor 36 and the signal detection transistor 32.

The interlayer insulating layer 160 includes a plurality of insulating sub-layers formed from, for example, silicon dioxide and covers the readout circuit 550, which is placed on the semiconductor substrate 190. Each pixel 10 includes a conductive structure 170 which electrically connects the second electrode 120 to the readout circuit 550 and which is placed in the interlayer insulating layer 160. As schematically shown in FIG. 4, the conductive structure 170 includes a via formed from metal such as copper, a plug formed from polysilicon, and the like and electrically connects the second electrode 120, the impurity region 191, and the gate electrode 32e of the signal detection transistor 32 to each other.

The counter electrode 140 of the photoelectric conversion section 540 is located on the side from which light from a subject comes. The counter electrode 140 is typically placed in the form of a single continuous electrode layer astride the pixels 10. The photoelectric conversion structure 130A may also be placed in the form of a single continuous photoelectric conversion structure astride the pixels 10. An optical filter 182 such as a color filter, a microlens 184, and the like may be placed on a principal surface of the counter electrode 140 that is opposite to the photoelectric conversion structure 130A.

Figure 5:
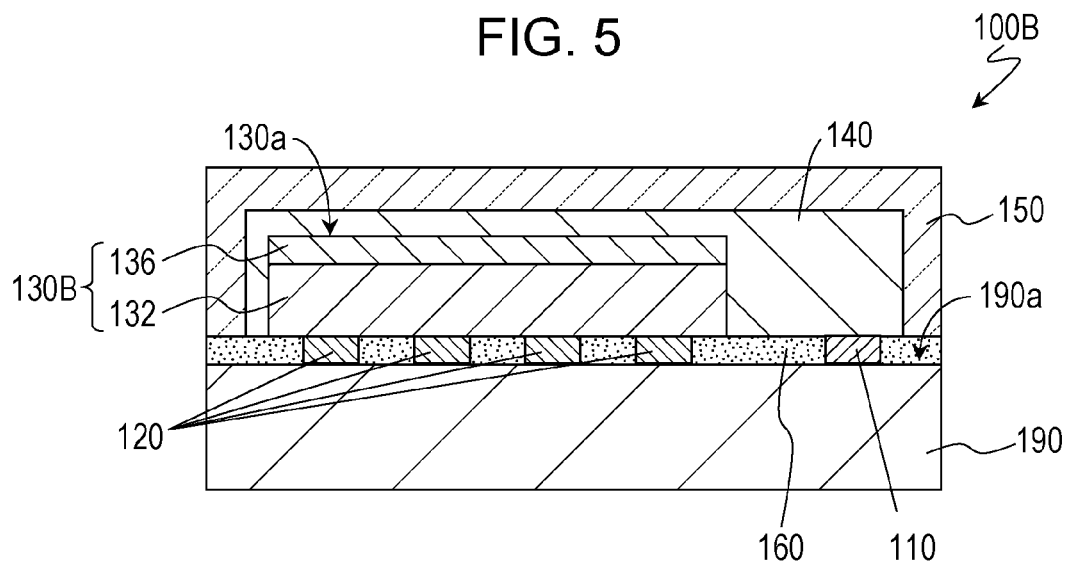
FIG. 5 is a schematic sectional view of another exemplary photoelectric conversion element obtained by a manufacturing method according to an embodiment of the present disclosure.

FIG. 5 schematically shows a cross section of another exemplary photoelectric conversion element 100B obtained by a manufacturing method according to an embodiment of the present disclosure. A main difference between the photoelectric conversion element 100B shown in FIG. 5 and the photoelectric conversion element 100A described with reference to FIG. 1 is that the photoelectric conversion element 100B includes a photoelectric conversion structure 130B instead of the photoelectric conversion structure 130A.

As schematically shown in FIG. 5, the photoelectric conversion structure 130B includes a photoelectric conversion layer 132 covering a plurality of second electrodes 120 and also includes an oxide semiconductor layer 136 placed on the photoelectric conversion layer 132. The oxide semiconductor layer 136, as well as the above-mentioned organic layer 134, can function as, for example, a hole-blocking layer. The oxide semiconductor layer 136 may have a photoelectric conversion function. The photoelectric conversion structure 130B may include an oxide semiconductor layer serving as, for example, an electron-blocking layer.

Exemplary Method for Manufacturing Photoelectric Conversion Element

Figure 6:
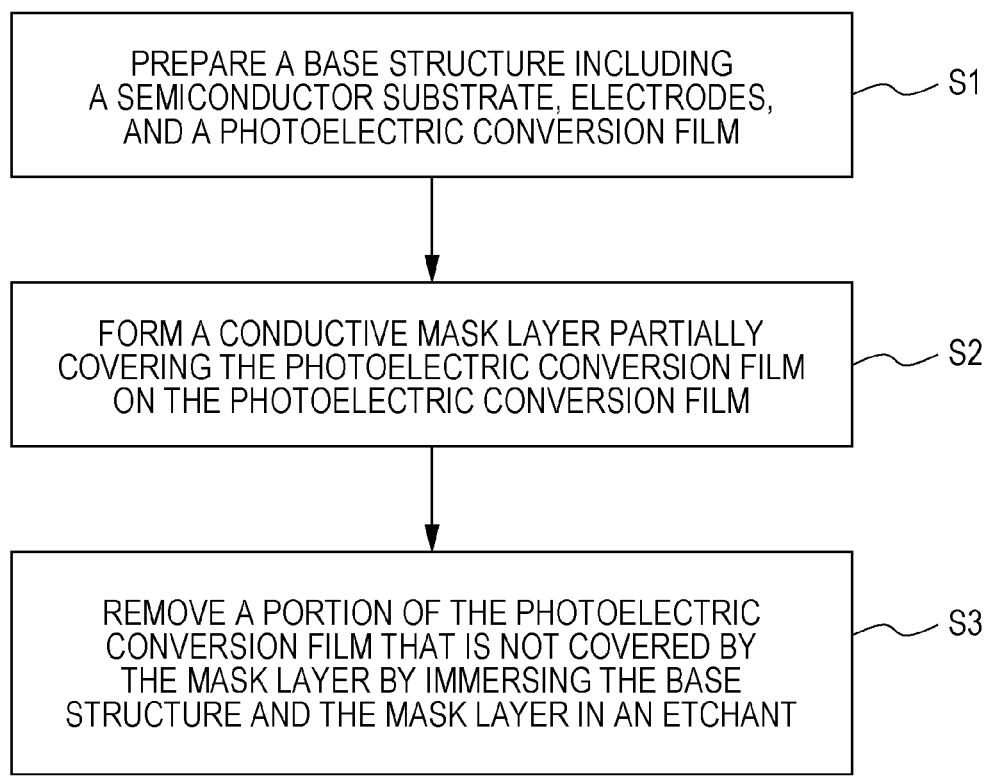
FIG. 6 is a flowchart showing the outline of a method for manufacturing a photoelectric conversion element according to an exemplary embodiment of the present disclosure.

FIG. 6 is a flowchart showing the outline of a method for manufacturing a photoelectric conversion element according to an exemplary embodiment of the present disclosure. The method for manufacturing the photoelectric conversion element exemplified in FIG. 6 roughly includes a step of preparing a base structure including a semiconductor substrate, a plurality of electrodes, and a photoelectric conversion film (Step S1 in FIG. 6); a step of forming a conductive mask layer covering a portion of the photoelectric conversion film on the photoelectric conversion film (Step S2 in FIG. 6); and a step of removing a portion not covered by the mask layer from the photoelectric conversion film by immersing the base structure and the mask layer in an etchant (Step S3 in FIG. 6).

Step of Preparing Base Structure

First, the base structure is prepared so as to include the semiconductor substrate, the electrodes, and the photoelectric conversion film. The semiconductor substrate has a principal surface. The electrodes are located on or above the principal surface. The photoelectric conversion film covers at least the electrodes. The base structure may be prepared by purchase or may be prepared in such a manner that the electrodes and the photoelectric conversion film are formed on one principal surface side of the semiconductor substrate in that order as described below.

Herein, first, an n-type silicon substrate serving as a support substrate is prepared and a p-well layer is formed on a principal surface of the n-type silicon substrate. Thereafter, signal detection transistors 32 and the like are formed on the principal surface side provided with the p-well layer, whereby readout circuits 550 are formed. This allows a semiconductor substrate 190 to be obtained. A known semiconductor process can be used to form the readout circuits 550. As described above, the semiconductor substrate 190 is not limited to a substrate entirely made of a semiconductor. For example, a glass substrate, a quartz substrate, or the like can be used as a support substrate. A substrate in and/or on which an electronic circuit can be provided can be used as a support substrate. A p-type silicon substrate may be used instead of the n-type silicon substrate.

Figure 7:
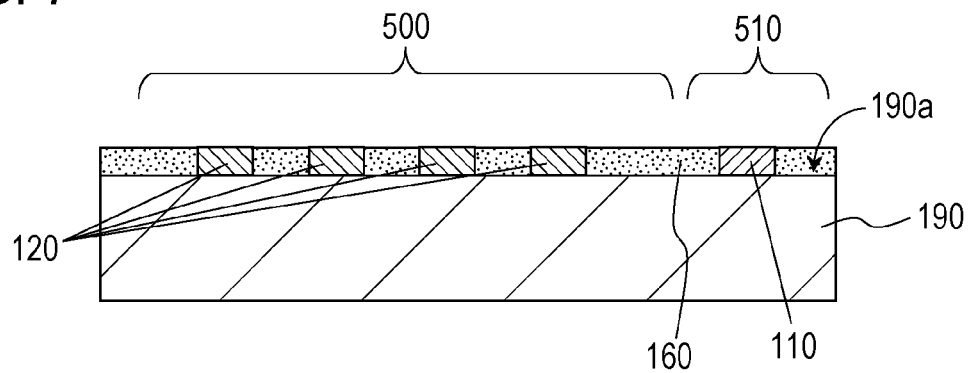
FIG. 7 is a schematic sectional view illustrating a method for manufacturing a photoelectric conversion element according to an exemplary embodiment of the present disclosure.

Next, as shown in FIG. 7, a plurality of second electrodes 120 serving as pixel electrodes are formed on the principal surface 190*a* side of the semiconductor substrate 190. Herein, a first electrode 110 is also formed on the principal surface 190*a* side thereof in a step of forming the second electrodes 120.

Typically, an insulating layer is formed so as to cover the principal surface 190*a* provided with the readout circuits 550, followed by forming the first electrode 110 and the second electrodes 120 on the insulating layer. As described with reference to FIG. 2, while the second electrodes 120 are placed in an imaging region 500, the first electrode 110 is placed in a peripheral region 510.

A physical vapor deposition (PVD) process and a chemical vapor deposition (CVD) process can be used to form the first electrode 110 and the second electrodes 120. A wiring material generally used in the field of semiconductor integrated circuits can be used to form the first electrode 110 and the second electrodes 120. An example of material for forming the first electrode 110 and the second electrodes 120 is a noble metal such as Ag, Pt, or Au or a transparent conductive material such as ITO. Material for forming the first electrode 110 and material for forming the second electrodes 120 need not be common.

In the case of forming a finer electrode pattern, the first electrode 110 and the second electrodes 120 may be formed in such a manner that, for example, after an electrode material is deposited, unnecessary portions are removed by dry etching. Applying one of Al, Ti, Mo, Ta, and W; an alloy containing one or more of these metals; a conductive silicide; a conductive nitride; or polycrystalline Si to the material for forming the first electrode 110 and the second electrodes 120 enables high-precision patterning by dry etching.

After the first electrode 110 and the second electrodes 120 are formed, gaps between the two second electrodes 120 adjacent to each other and gaps between the first electrode 110 and the second electrodes 120 are filled with an insulating material and a surface of the first electrode 110, surfaces of the second electrodes 120, and a layer of the insulating material are treated so as to be flush with each other. This enables an interlayer insulating layer 160 to be formed as schematically shown in FIG. 7. In FIG. 7, the first electrode 110 and the second electrodes 120 are illustrated as if the lower surface of the first electrode 110 and the lower surfaces of the second electrodes 120 are in contact with the principal surface 190*a*. This merely schematically shows the arrangement of the first electrode 110 and the second electrodes 120. As described with reference to FIG. 4, the first electrode 110 and the second electrodes 120 can be electrically connected to the readout circuits 550 with conductive structures placed in the interlayer insulating layer 160. In particular, each of the second electrodes 120 is connected to the gate of a corresponding one of the signal detection transistors 32 with a plug or the like and is thereby electrically connected to a corresponding one of the readout circuits 550.

Figure 8:
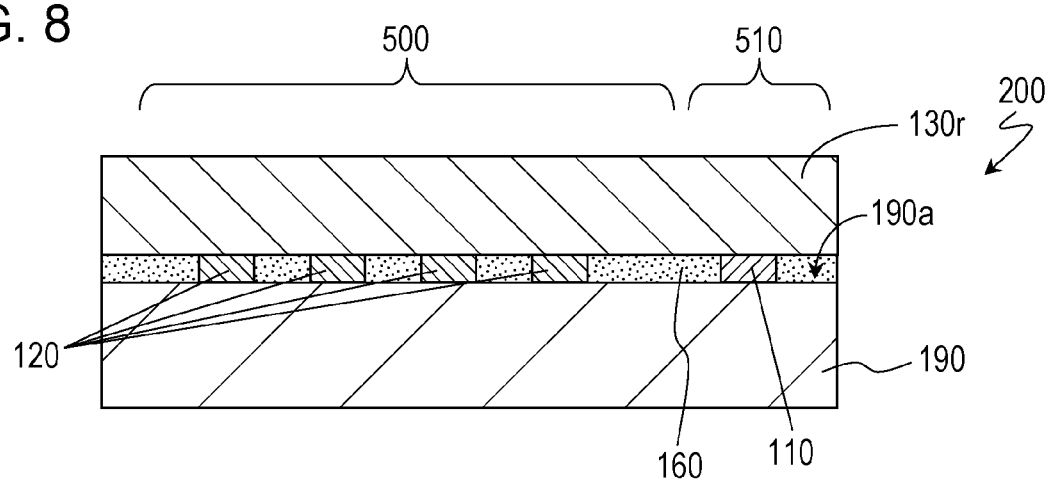
FIG. 8 is a schematic sectional view illustrating a method for manufacturing a photoelectric conversion element according to an exemplary embodiment of the present disclosure.

Next, a photoelectric conversion film 130*r* covering at least the second electrodes 120 is formed. Herein, as shown in FIG. 8, the photoelectric conversion film 130*r* is formed so as to entirely cover the principal surface 190*a* side of the semiconductor substrate 190. In an example described below, an organic material is used to form the photoelectric conversion film 130*r*. The photoelectric conversion film 130*r* typically contains an organic p-type semiconductor and an organic n-type semiconductor. A dry deposition process and a wet deposition process can both be used to form the photoelectric conversion film 130*r*. The dry deposition process used may be, for example, a vacuum vapor deposition process. The wet deposition process used may be an ink jet process, a spraying process, a nozzle printing process, a spin coating process, a dip coating process, a casting process, a die coating process, a roll coating process, a bar coating process, a gravure coating process, or the like. Forming the photoelectric conversion film 130*r* allows a base structure 200 including the photoelectric conversion film 130*r* on the principal surface 190*a* side to be obtained.

Figure 9:
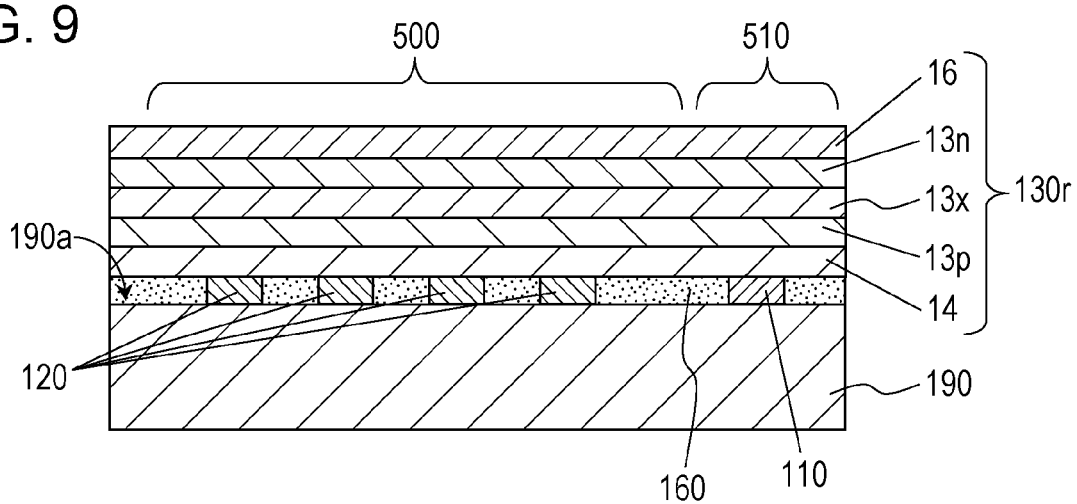
FIG. 9 is a schematic sectional view showing an example of the configuration of a photoelectric conversion film.

FIG. 9 schematically shows an example of the configuration of the photoelectric conversion film 130*r*. In this example, the photoelectric conversion film 130*r* has a multilayer structure including a plurality of layers formed from an organic material. The multilayer structure has a configuration in which an electron-blocking film 14, a p-type semiconductor film 13*p*, a mixture film 13*x*, an n-type semiconductor film 13*n*, and a hole-blocking film 16 are stacked in that order from the second electrode 120 side. The p-type semiconductor film 13*p* is located between the mixture film 13*x* and the electron-blocking film 14 and functions as a hole transport layer. The n-type semiconductor film 13*n* is located between the mixture film 13*x* and the hole-blocking film 16 and functions as an electron transport layer. FIG. 9 shows an example of a configuration in which, among positive and negative charges generated by photoelectric conversion, the positive charges are collected by the second electrodes 120 and holes are used as signal charges. In the case of a configuration in which, among the positive and negative charges generated by photoelectric conversion, the negative charges are collected by the second electrodes 120 and electrons are used as signal charges, the stacking order of the films included in the photoelectric conversion film 130*r* are reversed. That is, the hole-blocking film 16 and the n-type semiconductor film 13*n* are arranged on the second electrode 120 side and the electron-blocking film 14 and the p-type semiconductor film 13*p* are arranged on the side opposite to the second electrodes 120.

Figure 10:
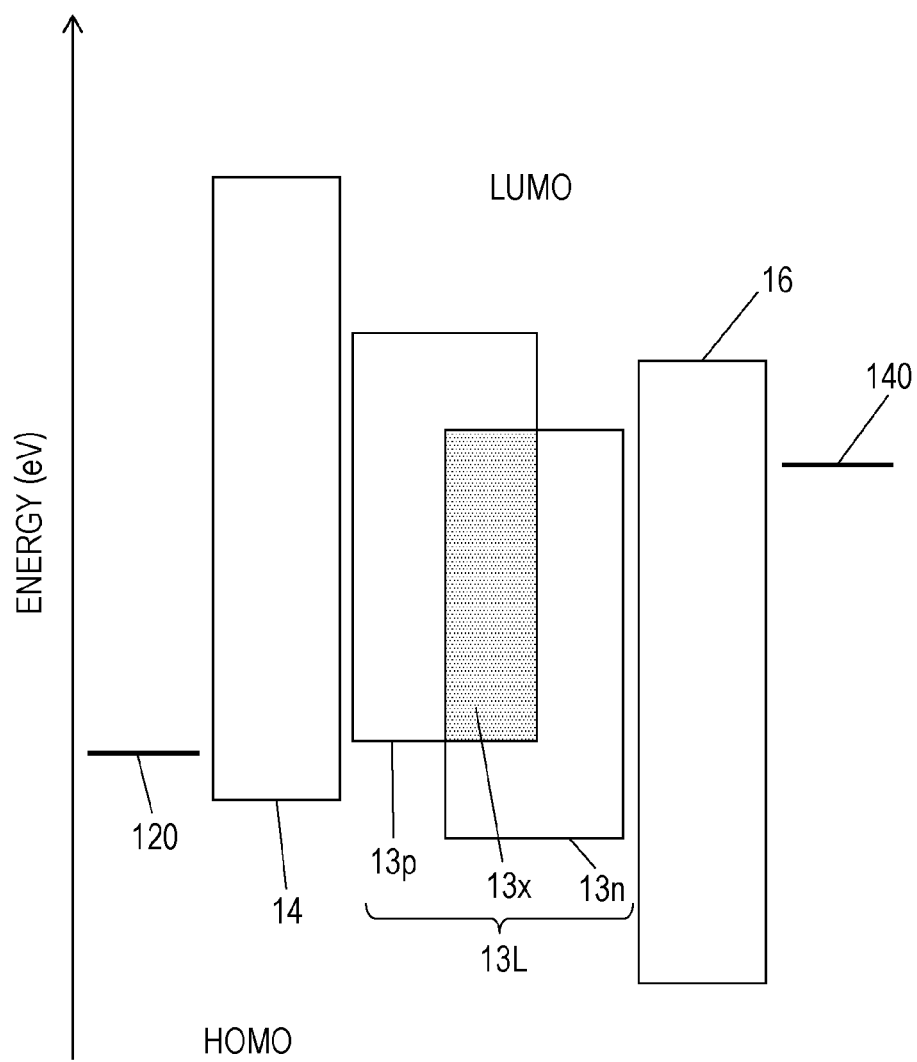
FIG. 10 is an energy diagram for the photoelectric conversion film exemplified in FIG. 9.

FIG. 10 is an energy diagram for the photoelectric conversion film 130*r*, which is exemplified in FIG. 9. In FIG. 10, the lower side of each rectangle schematically expresses the level of the highest occupied molecular orbital (HOMO) of material for forming a layer. The upper side of the rectangle schematically expresses the energy level of the lowest unoccupied molecular orbital (LUMO) of the material for forming the layer. In FIG. 10, thick horizontal lines schematically express the exemplary Fermi levels of a counter electrode 140 and the second electrodes 120. Hereinafter, the level of the highest occupied molecular orbital is simply referred to as the HOMO level and the energy level of the lowest unoccupied molecular orbital is simply referred to as the LUMO level in some cases.

As shown in FIG. 10, in typical, the HOMO level of the electron-blocking film 14 is lower than the HOMO level of the p-type semiconductor film 13p and the LUMO level of the electron-blocking film 14 is higher than the LUMO level of the p-type semiconductor film 13p. The electron-blocking film 14 is formed from, for example, an aromatic amine compound such as 4,4'-bis[N-(naphthyl)-N-phenyl-amino] biphenyl (α-NPD) that is an organic p-type semiconductor, a stilbene derivative, a pyrazoline derivative, a porphin derivative, a phthalocyanine derivative, a triazole derivative, an oxazole derivative, an imidazole derivative, a phenylenediamine derivative, an arylamine derivative, a fluorene derivative, an amino-substituted chalcone derivative, a fluorenone derivative, a hydrazone derivative, a silazane derivative, or the like. The electron-blocking film 14 has the function of reducing the dark current due to the injection of electrons into the photoelectric conversion film 130r from the second electrodes 120.

The organic p-type semiconductor is mainly typified by a hole-transporting organic compound and refers to an organic compound having the property of readily donating an electron. In particular, the organic p-type semiconductor refers to an organic compound having lower ionization potential in the case of using two organic compounds in contact with each other. Thus, the organic p-type semiconductor used may be any organic compound exhibiting electron-donating ability.

Examples of the organic p-type semiconductor include triarylamine compounds; benzidine compounds; pyrazoline compounds; styrylamine compounds; hydrazone compounds; triphenylmethane compounds; carbazole compounds; polysilane compounds; thiophene compounds such as α-sexithiophene (α-6T) and P3HT; phthalocyanine compounds; cyanine compounds; merocyanine compounds; oxonol compounds; polyamine compounds; indole compounds; pyrrole compounds; pyrazole compounds; polyarylene compounds; condensed aromatic polycyclic compounds such as naphthalene derivatives, anthracene derivatives, phenanthrene derivatives, tetracene derivatives such as rubrene, pyrene derivatives, perylene derivatives, and fluoranthene derivatives; and metal complexes containing a nitrogen-containing heterocyclic compound as a ligand. The organic p-type semiconductor used is not limited to these compounds and may be an organic compound having an ionization potential lower than that of organic compounds used as organic n-type semiconductors.

The hole-blocking film 16 has the function of reducing the dark current due to the injection of holes into the photoelectric conversion film 130r from the counter electrode 140. For example, the organic n-type semiconductor can be used to form the hole-blocking film 16. An oxide semiconductor material can be used to form the hole-blocking film 16 as described below.

As an organic material for forming the hole-blocking film 16, for example, the following materials can be used: fullerene, fullerene derivatives, copper phthalocyanine, 3,4,9,10-perylenetetracarboxylic dianhydride (PTCDA), acetylacetonate complexes, BCP, Alq, and the like. The hole-blocking film 16 is an example of the above-mentioned organic layer 134. When the hole-blocking film 16 has higher transmittance in the visible to near infrared range, a larger amount of light can reach a multilayer structure 13L including the p-type semiconductor film 13p, the mixture film 13x, and the n-type semiconductor film 13n. Material having no high absorption at a wavelength at which the multilayer structure 13L exhibits absorption may be selected as material for forming the hole-blocking film 16. Alternatively, the thickness of the hole-blocking film 16 may be minimized. The thickness of the hole-blocking film 16 depends on the specific configuration of the multilayer structure 13L, the thickness of the counter electrode 140, and the like. The thickness of the hole-blocking film 16 may be within the range of 2 nm to 50 nm.

The organic n-type semiconductor is mainly typified by an electron-transporting organic compound and refers to an organic compound having the property of readily accepting an electron. In particular, the organic n-type semiconductor refers to an organic compound having higher electron affinity in the case of using two organic compounds in contact with each other. Thus, the organic n-type semiconductor used may be any organic compound exhibiting electron-accepting ability.

Examples of the organic n-type semiconductor include fullerenes such as $C_{60}$ and $C_{70}$; fullerene derivatives such as [6,6]-phenyl-061-butyric acid methyl ester (PCBM), condensed aromatic polycyclic compounds such as naphthalene derivatives, anthracene derivatives, phenanthrene derivatives, tetracene derivatives, pyrene derivatives, perylene derivatives, and fluoranthene derivatives; nitrogen-, oxygen-, or sulfur-containing five- to seven-membered heterocyclic compounds such as pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyrrolidine, pyrrolopyridine, thiadiazolopyridine, dibenzazepine, and tribenzazepine; subphthalocyanine (SubPc); polyarylene compounds; fluorenone compounds; cyclopentadiene compounds; silyl compounds; perylenetetracarboxyldiimide (PTCDI) compounds; and metal complexes containing a nitrogen-containing heterocyclic compound as a ligand. The organic n-type semiconductor used is not limited to these compounds and may be an organic compound having an electron affinity higher than that of organic compounds used as organic p-type semiconductors.

When the electron-blocking film 14 is placed in the photoelectric conversion film 130r, material for forming the second electrodes 120 is selected from, for example, the above-mentioned materials in consideration of the bond strength between the counter electrode 140 and the second electrodes 120, stability, the difference in ionization potential therebetween, the difference in electron affinity therebetween, and the like. Likewise, material for forming the counter electrode 140 can be selected from known materials in consideration of the bond strength between the counter electrode 140 and a layer adjacent thereto, stability, the difference in ionization potential therebetween, the difference in electron affinity therebetween, and the like. When no hole-blocking film 16 is placed and the work function of the counter electrode 140 is relatively large, for example, about 4.8 eV, the potential barrier between the counter electrode 140 and the multilayer structure 13L is small and holes are likely to be injected into the multilayer structure 13L from the counter electrode 140. As a result, the dark current may possibly increase. However, in this embodiment, the hole-blocking film 16 is interposed between the counter electrode 140 and the multilayer structure 13L and therefore the effect of suppressing the dark current can be expected.

When the multilayer structure 13L is made of an organic semiconductor material, the photoelectric conversion film 130r may include a multilayer structure of an electron-donating organic material and an electron-accepting organic material, that is, a heterojunction. Alternatively, the photoelectric conversion film 130r may include a layer having a bulk heterojunction structure. The photoelectric conversion film 130r may have a combination of these.

Light incident on the photoelectric conversion film 130r can be absorbed by one or both of an electron-donating organic material and an electron-accepting organic material. When the photoelectric conversion structure 130A includes a bulk heterojunction structure layer, a disadvantage that the carrier diffusion length in the photoelectric conversion film 130r is short can be compensated for and the photoelectric conversion efficiency can be increased. The bulk heterojunction structure is described in detail in Japanese Patent No. 5553727.

Step of Forming Conductive Mask Layer on Photoelectric Conversion Film

Next, the mask layer is formed on the photoelectric conversion film 130r. In an embodiment of the present disclosure, the photoelectric conversion structure 130A is formed so as to include a portion of the photoelectric conversion film 130r in such a manner that the photoelectric conversion film 130r is partially removed by wet etching as described below. The mask layer functions as an etching mask protecting a portion of the photoelectric conversion film 130r that is located on the imaging region 500.

Figure 11:
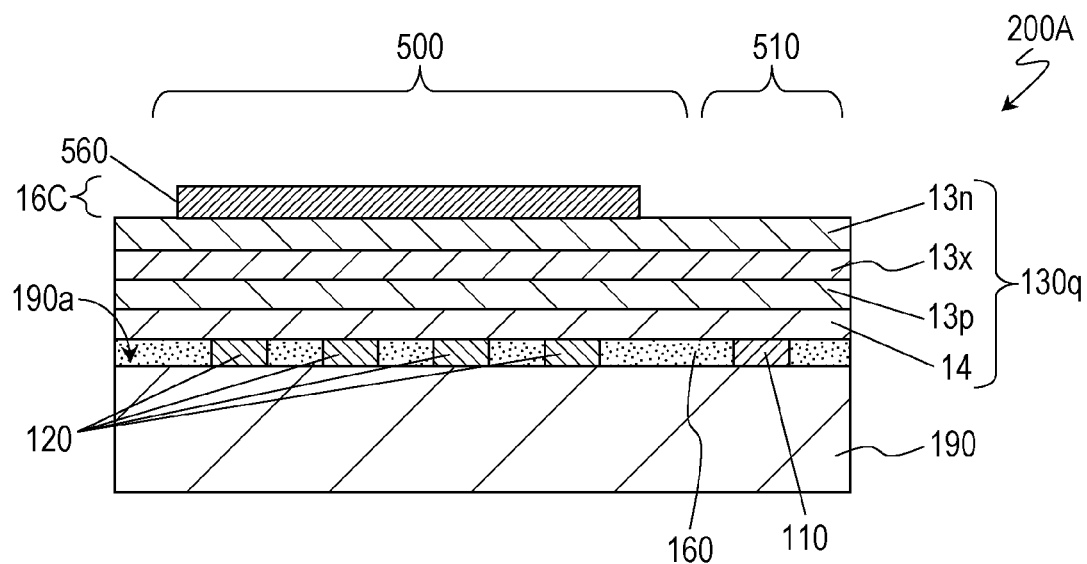
FIG. 11 is a schematic sectional view illustrating a method for manufacturing a photoelectric conversion element according to an exemplary embodiment of the present disclosure.

In an embodiment of the present disclosure, the mask layer is formed from an organic material and/or a transparent conductive material so as to cover at least a portion of the photoelectric conversion film 130r that overlaps the second electrodes 120 in plan view. For example, the following portion can be used as a mask layer: a remaining portion of the hole-blocking film 16 that is obtained by selectively removing a portion other than a portion located on the imaging region 500 from the hole-blocking film 16. That is, a mask layer 16C including a portion of a covering section 560 can be formed by patterning the hole-blocking film 16 as shown in FIG. 11. The mask layer may be formed from one or more of the organic material, the oxide semiconductor material, and the transparent conductive material so as to cover at least the portion of the photoelectric conversion film 130r that overlaps the second electrodes 120 as described below.

The hole-blocking film 16 can be patterned in such a manner that, after the hole-blocking film 16 is formed by, for example, a vacuum vapor deposition process or a coating process, a portion other than a portion located on, for example, the imaging region 500 is selectively removed from the hole-blocking film 16 by photolithography and etching. A pattern of an organic photoelectric conversion material may be directly formed by an ink jet process, an offset printing process, a gravure printing process, a flexographic printing process, or a screen printing process. Alternatively, a pattern of the organic photoelectric conversion material may be formed by a vacuum vapor deposition process using a mask. From the viewpoint of the influence of a resist, a developer, or a remover, the vacuum vapor deposition process using the mask is more advantageous than photolithography. Incidentally, it is not essential that the whole of a portion located on the peripheral region 510 is removed from the hole-blocking film 16. The mask layer 16C may include a portion located on the peripheral region 510 in addition to the covering section 560.

As schematically shown in FIG. 11, the covering section 560 of the mask layer 16C covers a portion of a photoelectric conversion film 130q that overlaps the second electrodes 120 in plan view. The photoelectric conversion film 130q is a multilayer structure composed of the electron-blocking film 14, the p-type semiconductor film 13p, the mixture film 13x, and the n-type semiconductor film 13n. Incidentally, even after the hole-blocking film 16 is patterned, the covering section 560 of the mask layer 16C can hold a function as a hole-blocking film. Thus, the whole of a multilayer structure composed of the electron-blocking film 14, the p-type semiconductor film 13p, the mixture film 13x, the n-type semiconductor film 13n, and the covering section 560 of the mask layer 16C can be referred to as a photoelectric conversion film.

In the case of forming the mask layer from an organic material, the organic material, which is used to form the mask layer, exhibits a lower etching rate for an etchant, used in a wet etching step below, rather than material for forming the photoelectric conversion film 130q. This enables the photoelectric conversion film 130q to be preferentially dissolved by wet etching and therefore enables the covering section 560 to be left on the photoelectric conversion film 130q after wet etching.

In particular, in the case of using a portion of the hole-blocking film 16 as the mask layer 16C, the hole-blocking film 16 is formed using the organic material, which exhibits a low etching rate for the etchant, which is used to wet-etch the photoelectric conversion film 130q in a step of forming the photoelectric conversion film 130r, rather than the photoelectric conversion film 130q. The hole-blocking film 16, which is an example of the organic layer 134 as described above, may have a photoelectric conversion function. That is, material making up the hole-blocking film 16 may be an organic photoelectric conversion material. In other words, the organic photoelectric conversion material can be used to form the mask layer 16C.

The mask layer may be formed from the transparent conductive material instead of the organic material. In the case of using the transparent conductive material as a hard mask material, after the transparent conductive material is deposited on the photoelectric conversion film 130r by sputtering or a coating process, a portion located on the peripheral region 510 is selectively removed from a film of the transparent conductive material by photolithography and etching. The transparent conductive material used to form the mask layer may be the same as that used to form the counter electrode 140. Similarly to using the organic material to form the mask layer, a pattern of the transparent conductive material may be directly formed on the photoelectric conversion film 130r by an ink jet process. Alternatively, a pattern of the transparent conductive material may be formed by a vacuum vapor deposition process using a mask. From the viewpoint of the influence of a resist, a developer, or a remover, the vacuum vapor deposition pressure using the mask is more advantageous than photolithography.

Figure 12:
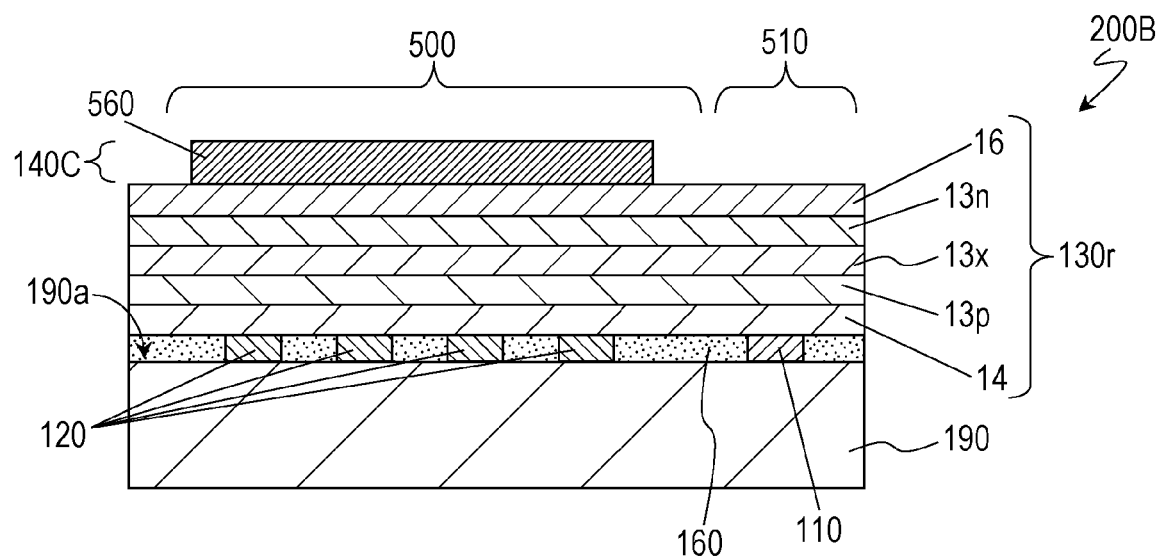
FIG. 12 is a schematic sectional view illustrating a method for manufacturing a photoelectric conversion element according to an exemplary embodiment of the present disclosure.

As shown in FIG. 12, a conductive mask layer 140C including a covering section 560 can be formed in such a manner that, for example, a portion other than a portion located on a imaging region 500 is selectively removed from a film of the transparent conductive material by patterning the transparent conductive material film. As is the case with an example described with reference to FIG. 11, the covering section 560 of the mask layer 140C covers a portion of a photoelectric conversion film 130r that overlaps a plurality of second electrodes 120 in plan view. As is the case with the example described with reference to FIG. 11, it is not essential that the whole of a portion located on a peripheral region 510 is removed from the transparent conductive material film. The mask layer 140C may include a portion located on the peripheral region 510 in addition to the covering section 560.

Figure 13:
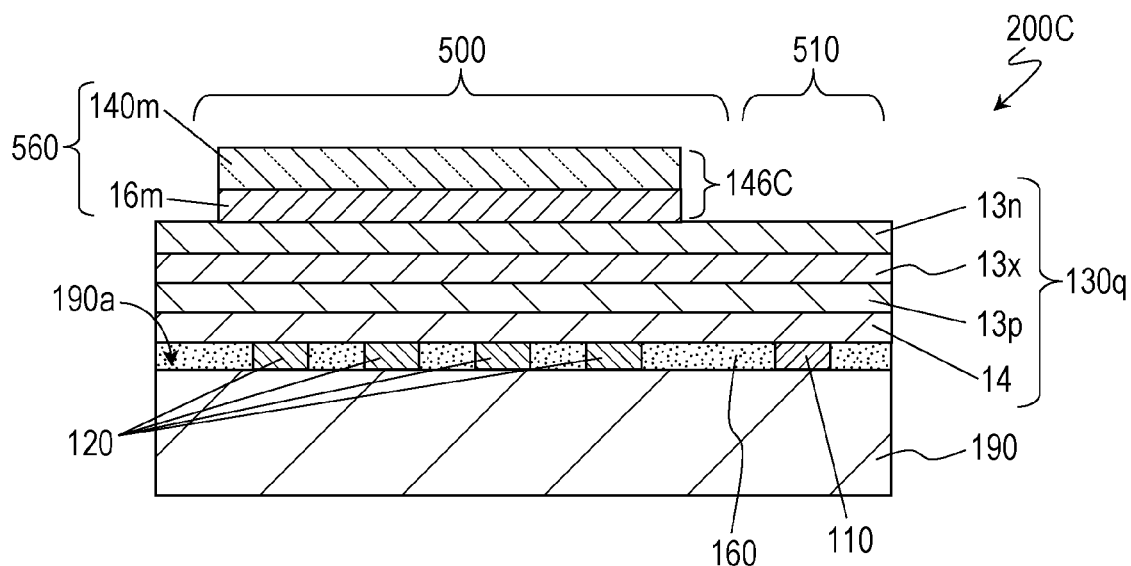
FIG. 13 is a schematic sectional view illustrating a method for manufacturing a photoelectric conversion element according to an exemplary embodiment of the present disclosure.

Alternatively, a mask layer 146C may be formed in such a manner that a hole-blocking film 16 and a film of the transparent conductive material that is located on the hole-blocking film 16 are both patterned. For example, as shown in FIG. 13, the mask layer 146C may be formed on a photoelectric conversion film 130q so as to include an organic layer 16m that is a portion of the hole-blocking film 16 and a transparent conductive layer 140m that is a portion of the transparent conductive material film. A covering section 560 of the mask layer 146C also covers a portion of the photoelectric conversion film 130q that overlaps a plurality of second electrodes 120 in plan view.

Step of Partially Removing Photoelectric Conversion Film by Wet Etching

Figure 14:
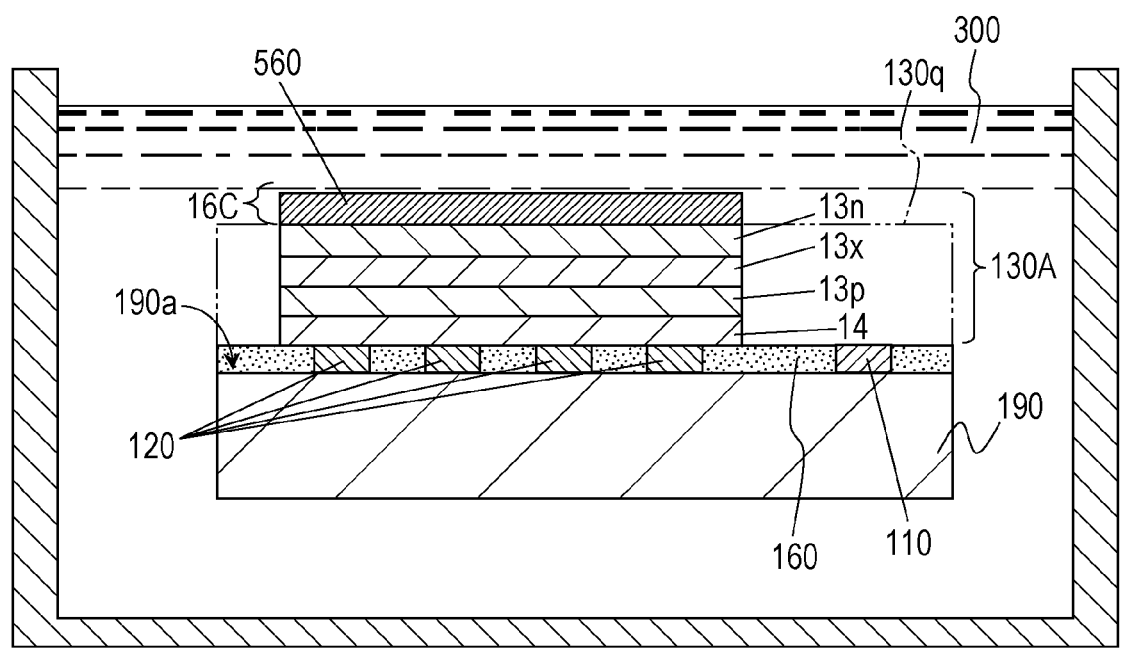
FIG. 14 is a schematic sectional view illustrating a method for manufacturing a photoelectric conversion element according to an exemplary embodiment of the present disclosure.

Next, the base structure 200 and the mask layer are immersed in an etchant, whereby the photoelectric conversion film is partially removed. For example, a base structure 200A including the mask layer 16C, which is formed from the hole-blocking film 16 as shown in FIG. 11, is immersed in an etchant 300. The etching rate of the mask layer 16C with respect to the etchant 300 is lower than the etching rate of the photoelectric conversion film 130q as described above. Therefore, as schematically shown in FIG. 14, the photoelectric conversion structure 130A can be formed so as to have a shape corresponding to the covering section 560 in such a manner that a portion not covered by the mask layer 16C is selectively removed from the photoelectric conversion film 130q by immersion in the etchant 300. A portion of the covering section 560 that remains after the completion of the wet etching step and a portion of the photoelectric conversion film 130q that remains after the completion of the wet etching step correspond to the organic layer 134 and the photoelectric conversion layer 132, respectively, shown in FIG. 1. In this example, the portion of the covering section 560 that remains after the completion of the wet etching step can function as a hole-blocking layer.

If the etching rate of the mask layer 16C is higher than the etching rate of the photoelectric conversion film 130q, the etchant 300 used may be an arbitrary liquid. The etching rate of each of the mask layer 16C and the photoelectric conversion film 130q can be controlled with a parameter such as the molecular polarity of the etchant 300 or the presence or absence of an aromatic ring. An example of the etchant 300 is acetone or a mixture of acetone and ethanol.

Figure 15A:
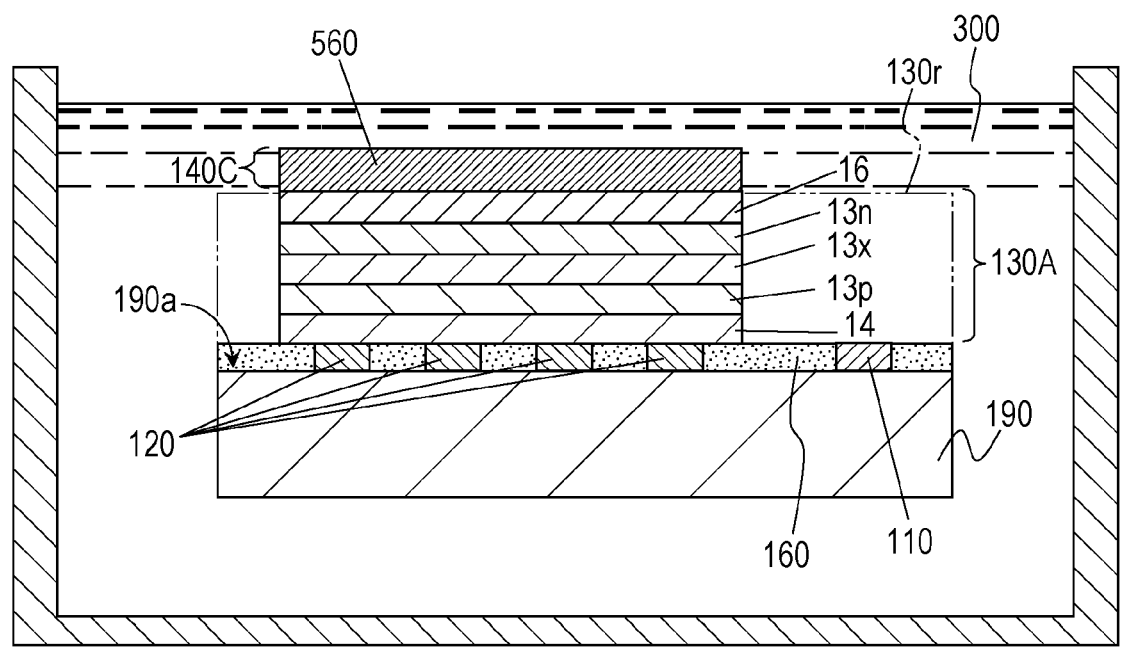
FIG. 15A is a schematic sectional view illustrating a method for manufacturing a photoelectric conversion element according to an exemplary embodiment of the present disclosure.

In the case of using a base structure 200B shown in FIG. 12 or a base structure 200C shown in FIG. 13, the base structure 200B or the base structure 200C may be immersed in the etchant 300 instead of the base structure 200A. Immersing, for example, the base structure 200B in the etchant 300 allows a portion not covered by the covering section 560 to be selectively removed from the photoelectric conversion film 130r as schematically shown in FIG. 15A, thereby enabling the photoelectric conversion structure 130A, which has the shape corresponding to the covering section 560, to be formed. In the case of wet etching the base structure 200C by immersing the base structure 200C in the etchant 300, the etchant 300 used may be a liquid exhibiting a higher etching rate for the photoelectric conversion film 130q rather than an organic layer 16m in the mask layer 146C as is the case with an example described with reference to FIG. 14.

Figure 15B:
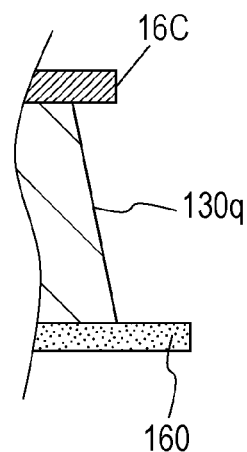
FIG. 15B is an enlarged schematic sectional view of a side end portion of a photoelectric conversion film after a step of partially removing the photoelectric conversion film by wet etching.
Figure 15C:
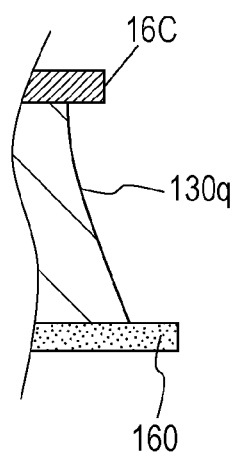
FIG. 15C is an enlarged schematic sectional view of a side end portion of a photoelectric conversion film after a step of partially removing the photoelectric conversion film by wet etching.

FIGS. 15B and 15C are enlarged sectional views of a side end portion of the photoelectric conversion film 130q after a step of partially removing the photoelectric conversion film 130q by wet etching as shown in FIG. 14. Since wet etching is isotropic etching, a portion of the photoelectric conversion film 130q that is covered by the mask layer 16C is etched with the etchant 300 inside a side surface of the mask layer 16C along a horizontal direction. As a result, as shown in FIGS. 15B and 15C, the following form is obtained: a form that the mask layer 16C extends outside the side end portion of the photoelectric conversion film 130q along a surface of the mask layer 16C. In a cross-sectional perpendicular to the principal surface 190a, a side surface of the photoelectric conversion film 130q has a straight tapered form as shown in FIG. 15B or a curved tapered form as shown in FIG. 15C. Incidentally, in the case of performing the step of partially removing the photoelectric conversion film 130r by wet etching using the mask layer 140C formed from the transparent conductive material as shown in FIG. 15A, a side surface of the photoelectric conversion film 130r has a similar form.

Step of Forming Light-Transmissive Electrode

Figure 16A:
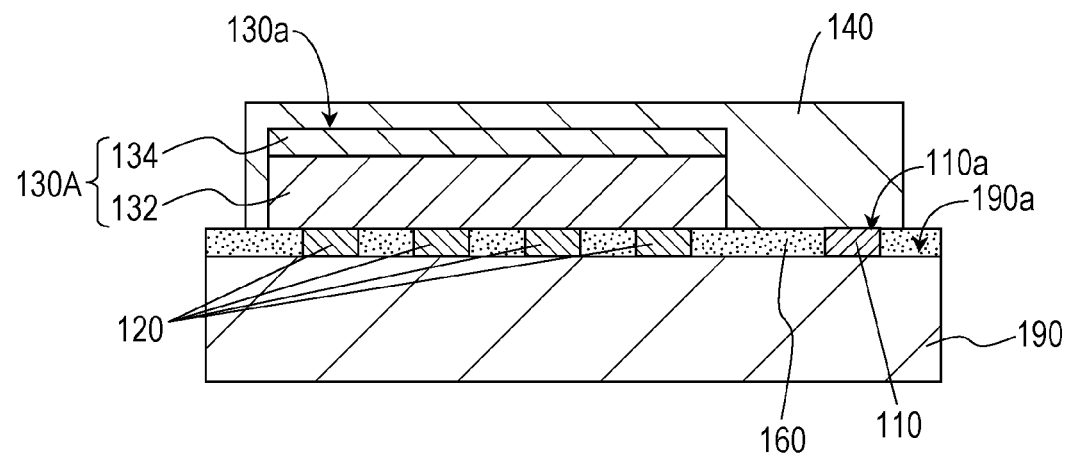
FIG. 16A is a schematic sectional view illustrating a method for manufacturing a photoelectric conversion element according to an exemplary embodiment of the present disclosure.

Herein, first, a subsequent step in the case of forming the photoelectric conversion structure 130A by immersing the base structure 200A shown in FIG. 11 in the etchant 300 is described. After the photoelectric conversion structure 130A is obtained from the photoelectric conversion film 130q and the covering section 560 of the mask layer 16C by wet etching, the counter electrode 140, which serves as a light-transmissive third electrode, is formed so as to cover a portion used as the covering section 560 as shown in FIG. 16A. The counter electrode 140 extends to at least the position of the first electrode 110 and covers the upper surface 110a of the first electrode 110. Forming the counter electrode 140 allows the hole-blocking film 16 and the first electrode 110 to be electrically connected to each other with the counter electrode 140 therebetween.

For example, high-frequency magnetron sputtering can be used to form the counter electrode 140. A transparent electrode material such as ITO is deposited under, for example, a 1 Pa Ar atmosphere.

In the case of forming the photoelectric conversion structure 130A by immersing the base structure 200B shown in FIG. 12 or the base structure 200C shown in FIG. 13 in the etchant 300, a structure similar to an example shown in FIG. 16A can be obtained in such a manner that the counter electrode 140 is formed by depositing the transparent electrode material so as to include a portion of the covering section 560, which is light-transmissive.

Figure 16B:
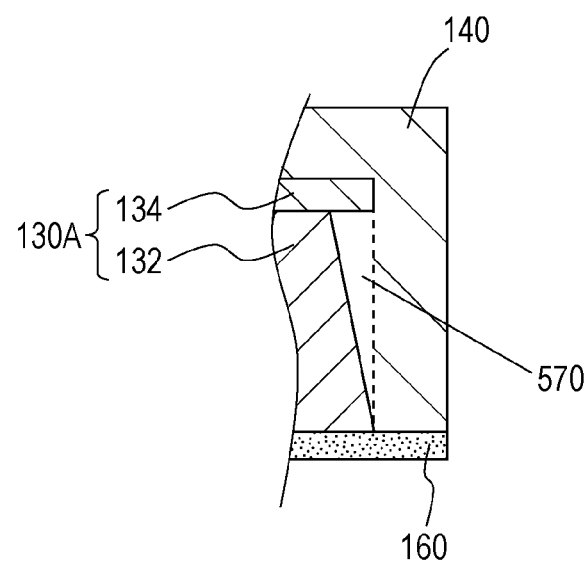
FIG. 16B is an enlarged schematic sectional view of a side end portion of a photoelectric conversion structure after forming a counter electrode.

FIG. 16B is an enlarged sectional view of a side end portion of the photoelectric conversion structure 130A shown in FIG. 16A after forming the counter electrode 140. Since a portion of the photoelectric conversion layer 132 that is covered by the organic layer 134 is etched inside a side surface of the organic layer 134 along a horizontal direction in a step of partially removing the photoelectric conversion layer 132 using the etchant 300, a gap 570 occurs between the counter electrode 140 and a side surface of the photoelectric conversion layer 132.

Typically, after the counter electrode 140 is formed, a protective layer 150 is formed so as to cover a structure on the semiconductor substrate 190. Forming the protective layer 150 enables the deterioration of the photoelectric conversion structure 130A due to being directly exposed to outside air to be suppressed. An example of the protective layer 150 is a monolayer film of aluminium oxide, silicon oxide, silicon nitride, or silicon oxynitride or a multilayer film containing two or more of aluminium oxide, silicon oxide, silicon nitride, and silicon oxynitride. A PVD process such as sputtering, a plasma-enhanced CVD process, a catalytic CVD process, an atomic layer deposition (ALD) process, and the like can be used to form the protective layer 150. Alternatively, high-frequency magnetron sputtering may be used to form the protective layer 150. The protective layer 150 may be formed in such a manner that aluminium oxide is deposited under, for example, a 1 Pa atmosphere containing Ar and $O_2$ so as to cover the counter electrode 140.

Through the above steps, the photoelectric conversion element 100A is obtained as shown in FIG. 1. An example that the organic materials are used to form the electron-blocking film 14 and the hole-blocking film 16 has been described above. An electron-blocking film and/or a hole-blocking film may be formed from an oxide semiconductor as described below. In this case, for example, an oxide semiconductor layer or a combination of the oxide semiconductor layer and a transparent conductive layer 140m can be used as mask layer.

Step of Preparing Base Structure

A method for manufacturing a photoelectric conversion element according to another embodiment of the present disclosure is described below. As is the case with the above-mentioned example, first, the following base structure is prepared: a base structure including a semiconductor substrate having a principal surface, a plurality of electrodes located on or above the principal surface, and a photoelectric conversion film covering at least the electrodes. For example, a semiconductor substrate 190 is prepared and a plurality of second electrodes 120 and a first electrode 110 are formed on the principal surface 190a side of the semiconductor substrate 190. Furthermore, an interlayer insulating layer 160 is formed. This allows a structure shown in FIG. 7 to be obtained.

Next, a photoelectric conversion film is formed so as to cover at least the second electrodes 120. Herein, an electron-blocking layer 14s is formed on the principal surface 190a side of the semiconductor substrate 190 so as to cover at least the second electrodes 120. Examples of material for forming the electron-blocking layer 14s include calcium oxide, chromium oxide, copper chromium oxide, manganese oxide, cobalt oxide, nickel oxide, copper oxide, copper gallium oxide, copper strontium oxide, niobium oxide, molybdenum oxide, copper indium oxide, silver indium oxide, and iridium oxide.

Figure 17:
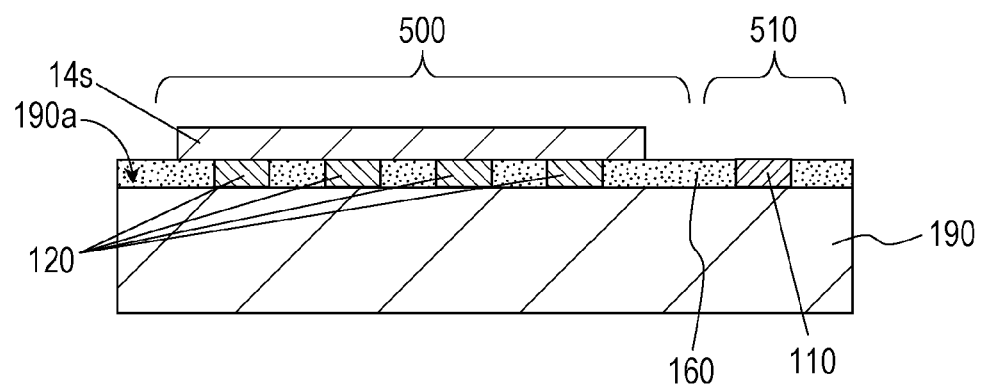
FIG. 17 is a schematic sectional view illustrating a method for manufacturing a photoelectric conversion element according to another exemplary embodiment of the present disclosure.

In the case of forming the electron-blocking layer 14s from at least one of these oxides, the electron-blocking layer 14s is not removed using the above-mentioned etchant 300. Therefore, patterning is carried out at the stage of depositing or applying the material for forming the electron-blocking layer 14s. For example, after the material for forming the electron-blocking layer 14s is provided by a vacuum vapor deposition process or a coating process, a portion located on a peripheral region 510 is selectively removed from a film of the material for forming the electron-blocking layer 14s by photolithography and etching. Alternatively, a pattern of an oxide semiconductor may be formed by a vacuum vapor deposition process using a mask or a sputtering process. This enables the electron-blocking layer 14s to be formed such that the electron-blocking layer 14s covers a region to be formed into an imaging region 500 as shown in FIG. 17.

Since forming the electron-blocking layer 14s from an oxide semiconductor material allows the electron-blocking layer 14s to have reduced resistance as compared to forming the electron-blocking layer 14s from an organic material, the electron-blocking layer 14s has a small voltage drop; hence, a higher voltage can be applied to an organic photoelectric conversion film. Therefore, the photoelectric conversion efficiency can be increased without varying the bias applied between the second electrodes 120 and a counter electrode 140. Using the oxide semiconductor material to form the electron-blocking layer 14s eliminates the possibility of dissolution of the electron-blocking layer 14s in a solution of material for forming an organic film even in the case where the organic film is formed on the electron-blocking layer 14s by a coating process in a subsequent step. Thus, it is easier to form a multilayer structure functioning as a photoelectric conversion structure.

Figure 18:
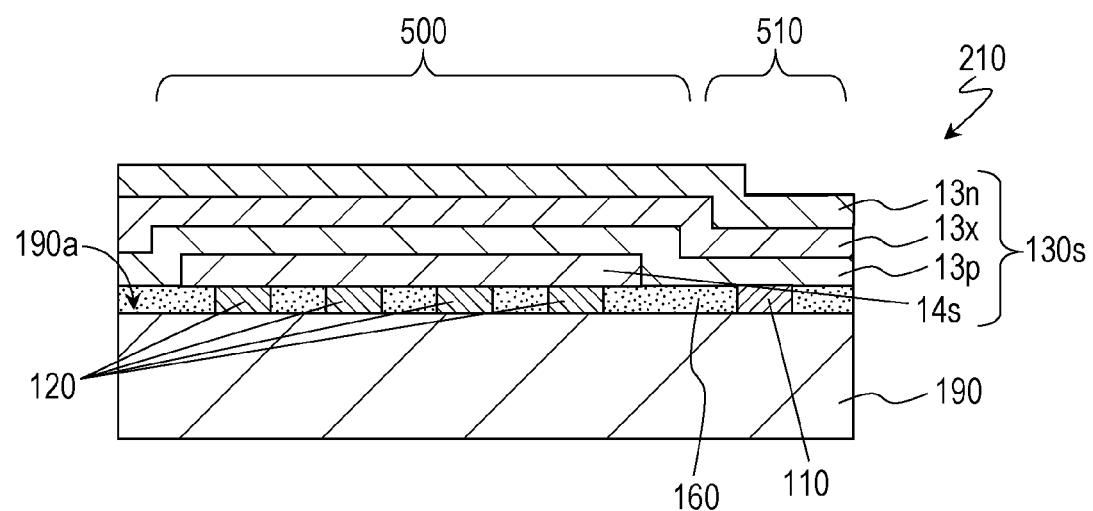
FIG. 18 is a schematic sectional view illustrating a method for manufacturing a photoelectric conversion element according to another exemplary embodiment of the present disclosure.

Next, a p-type semiconductor film 13p, a mixture film 13x, and an n-type semiconductor film 13n are formed on the principal surface 190a side. In this operation, as shown in FIG. 18, the p-type semiconductor film 13p, the mixture film 13x, and the n-type semiconductor film 13n may be formed so as to cover not only the electron-blocking layer 14s but also the region to be formed into the imaging region 500. This allows a base structure 210 including a photoelectric conversion film 130s which includes the electron-blocking layer 14s, the p-type semiconductor film 13p, the mixture film 13x, and the n-type semiconductor film 13n and which is located on the principal surface 190a side to be obtained.

Step of Forming Conductive Mask Layer on Photoelectric Conversion Film

Figure 19:
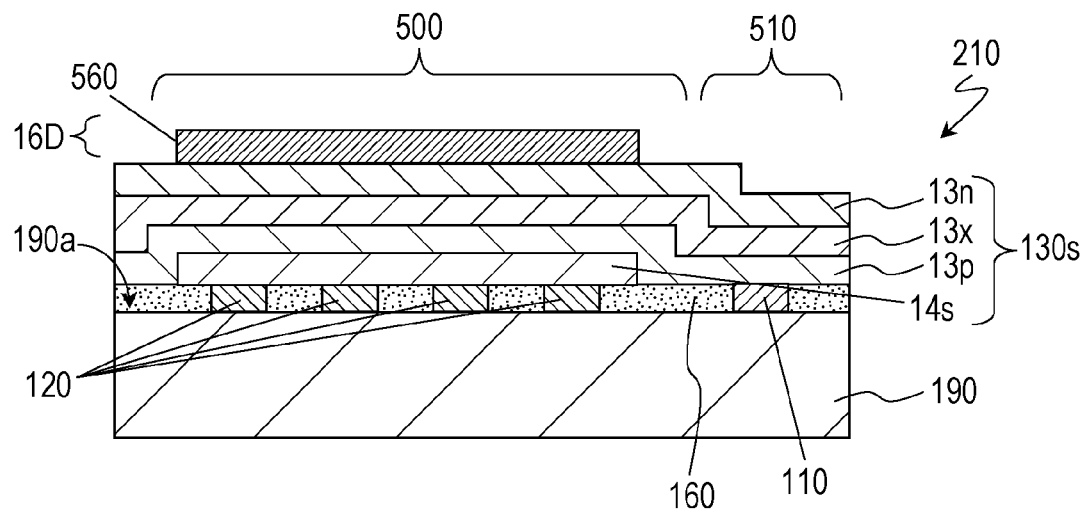
FIG. 19 is a schematic sectional view illustrating a method for manufacturing a photoelectric conversion element according to another exemplary embodiment of the present disclosure.

Next, as shown in FIG. 19, a mask layer 16D is formed so as to cover at least a portion of a multilayer structure including the p-type semiconductor film 13p, the mixture film 13x, and the n-type semiconductor film 13n, the portion overlapping the second electrodes 120 in plan view. Herein, the mask layer 16D formed is an oxide semiconductor layer. A portion of the oxide semiconductor layer that is located on the region to be formed into the imaging region 500 functions as a covering section 560. A portion of the oxide semiconductor layer that corresponds to the covering section 560 can function as a hole-blocking layer after the completion of an etching step as described below.

An example of material for forming the mask layer 16D is an oxide semiconductor such as titanium oxide, tin oxide, indium oxide, tungsten oxide, niobium oxide, or zinc oxide. A process similar to that used to form the electron-blocking layer 14s can be used to form a hole-blocking layer serving as the mask layer 16D. For example, after the oxide semiconductor material is provided on the n-type semiconductor film 13n by a vacuum vapor deposition process or a coating process, a portion located on the peripheral region 510 is selectively removed from a film of the oxide semiconductor material by photolithography and etching. Alternatively, a pattern of the oxide semiconductor may be formed by a vacuum vapor deposition process using a mask or a sputtering process. A pattern of the oxide semiconductor may be directly formed by an ink jet process, an offset printing process, a gravure printing process, a flexographic printing process, or a screen printing process. This enables the mask layer 16D to be formed such that the mask layer 16D includes the covering section 560.

Step of Partially Removing Photoelectric Conversion Film by Wet Etching

Figure 20:
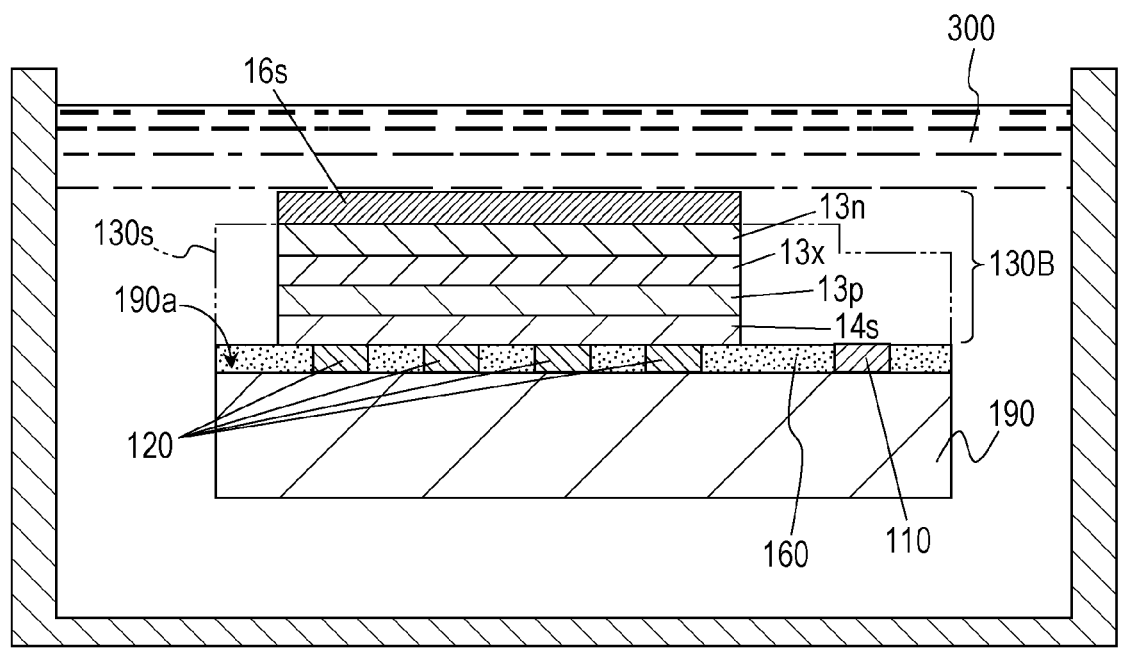
FIG. 20 is a schematic sectional view illustrating a method for manufacturing a photoelectric conversion element according to another exemplary embodiment of the present disclosure.

Next, the base structure 210 and the mask layer 16D are immersed in the etchant 300, whereby the photoelectric conversion film 130s is partially removed. The mask layer 16D is insoluble in the etchant 300. As shown in FIG. 20, a photoelectric conversion structure 1306 can be formed so as to have a shape corresponding to the covering section 560 in such a manner that a portion not covered by the mask layer 16D is selectively removed from the photoelectric conversion film 130s by immersion in the etchant 300. A portion of the covering section 560 that remains after the completion of a wet etching step and a portion of the photoelectric conversion film 130s that remains after the completion of the wet etching step correspond to the oxide semiconductor layer 136 and the photoelectric conversion layer 132, respectively, shown in FIG. 5. In this example, the portion of the covering section 560 that remains after the completion of the wet etching step can function as a hole-blocking layer 16s.

An energy diagram for the photoelectric conversion structure 1306 shown in FIG. 20 may be substantially the same as the energy diagram in the example described with reference to FIG. 10. Herein, since the oxide semiconductor is used to form the electron-blocking layer 14s and the hole-blocking layer 16s, the position of the upper side of a rectangle representing each of the electron-blocking layer 14s and the hole-blocking layer 16s may be replaced with the bottom of the conduction band in a corresponding one of the electron-blocking layer 14s and the hole-blocking layer 16s and the position of the lower side thereof may be replaced with the top of the valence band in in a corresponding one of the electron-blocking layer 14s and the hole-blocking layer 16s. Using an oxide semiconductor material to form the hole-blocking layer 16s, as well as forming the electron-blocking layer 14s from the oxide semiconductor material, allows the resistance and the voltage drop to be small; hence, the photoelectric conversion efficiency can be increased by applying a higher voltage to an organic photoelectric conversion film.

Step of Forming Light-Transmissive Electrode

Next, as is the case with the example described with reference to FIG. 16A, the counter electrode 140, which serves as a light-transmissive third electrode, is formed so as to cover the covering section 560. Through the above steps, the photoelectric conversion element 1006 shown in FIG. 5 is obtained. A layer of the oxide semiconductor material that serves as the hole-blocking layer 16s may be used as an etching mask like this example. Incidentally, as is the case with the example described with reference to FIG. 13, the photoelectric conversion film 130s may be etched in such a manner that a transparent conductive layer 140m is formed on the covering section 560 of the mask layer 16D and the mask layer 16D and the transparent conductive layer 140m are used as an etching mask.

In the above embodiments, an electron-blocking layer is placed on the second electrode 120 side and a hole-blocking layer is placed on the counter electrode 140 side. In contrast, even in the case where the hole-blocking layer is placed on the second electrode 120 side and the electron-blocking layer is placed on the counter electrode 140 side, a photoelectric conversion film can be etched using the electron-blocking layer or a transparent electrode layer as an etching mask.

According to an embodiments of the present disclosure, a mask layer formed from, for example, at least one of an organic material, a transparent conductive material, and an oxide semiconductor material is used to etch a photoelectric conversion film and therefore a step of removing a mask layer after etching can be eliminated. In particular, using an organic photoelectric material to form a mask layer enables a portion of a covering section 560 that remains after etching, the covering section 560 being a portion of the mask layer, to be used as a portion of a photoelectric conversion structure 130A, for example, a charge-blocking layer. Alternatively, using the transparent conductive material to form a mask layer enables a counter electrode 140 including a portion of a covering section 560 to be formed.

In an embodiment of the present disclosure, a photoelectric conversion film 130r or a photoelectric conversion film 130q are patterned by wet etching. Wet etching enables the occurrence of a white defect to be suppressed by reducing the dark current as described below with reference to examples. Thus, the effect of increasing the yield is obtained. This is probably because, although there is a difference in stress between the interface between the photoelectric conversion film 130r or 130q and each of second electrodes 120 and the interface between the photoelectric conversion film 130r or 130q and a mask layer, the stress is reduced by carrying out wet etching.

In an embodiment of the present disclosure, a photoelectric conversion film is selectively patterned by wet-etching a structure, including the photoelectric conversion film, capable of functioning as a device and an etching mask is used as a conductive structure after wet etching. Thus, a photoelectric conversion element can be obtained in such a state that the stress in a photoelectric conversion structure is reduced and the etching mask is left. Incidentally, using wet etching instead of dry etching, which is generally used to etch photoelectric conversion films, enables the deterioration of sensitivity near a surface formed by dry etching to be avoided.

EXAMPLES

White defects occur because relatively large dark currents as compared to those in the surroundings are generated in a photoelectric conversion structure. Thus, whether the number of the white defects is large of small can be evaluated depending on the magnitude of the current flowing in the photoelectric conversion structure. Herein, samples simulating a photoelectric conversion structure for use in photoelectric conversion elements were prepared and the magnitude of the current in each sample was measured, whereby the effect of suppressing a white defect by an embodiment of the present disclosure was investigated.

Example 1 and Comparative Example 1

A sample of Example 1 and a sample of Comparative Example 1 were prepared by a procedure below. First, a 0.7 mm thick glass substrate having a principal surface overlaid with a lower electrode made from an ITO film with a thickness of 150 nm was prepared. Next, a mixture film was formed on the lower electrode, which corresponded to the above-mentioned second electrodes 120, by a coating process from a mixture solution of $(OC_2H_5)_8Sn(OSi(C_6H_{13})_3)_2Nc$ represented by a structural formula below and PCBM available from Frontier Carbon Corporation. In the mixture solution, which was used for film formation, the weight ratio of $(OC_2H_5)_8Sn(OSi(C_6H_{13})_3)_2Nc$ to PCBM was 1:9 and 30 mg/ml of chloroform was used. In the structural formula below, Et represents $C_2H_5$ and Hex represents $C_6H_{13}$. The thickness of the mixture film, which was obtained in this operation, was about 250 nm.

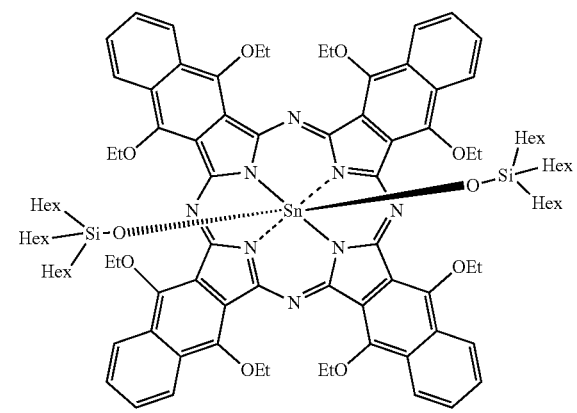

*Et = $C_2H_5$, Hex = $C_6H_{13}$

Figure 21:
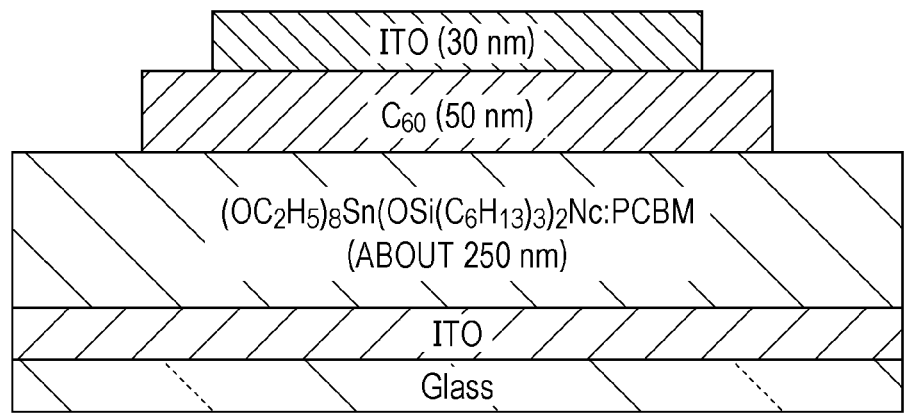
FIG. 21 is a schematic sectional view showing the configuration of a stack prepared in Comparative Example 1.

Furthermore, $C_{60}$ was deposited to a thickness of 50 nm on a region of the mixture film, which served as a photoelectric conversion layer, through a first shadow mask made of metal by a vacuum vapor deposition process. Thereafter, an upper electrode, that is, an ITO film with a thickness of about 30 nm was formed on a layer of $C_{60}$ through a second shadow mask provided with a small opening by a sputtering process. The $C_{60}$ layer played a role as a hole-blocking layer. FIG. 21 schematically shows the configuration of a stack obtained in this operation.

The current density induced between the upper electrode and the lower electrode was measured under a nitrogen atmosphere using a semiconductor device parameter analyzer, B1500A, available from Keysight Technologies Inc. in such a state that a bias of 5 V was applied between the upper electrode and the lower electrode, whereby a value of $2.3 \times 10^{-4}$ mA/cm$^2$ was obtained. The measurement obtained in this operation was defined as the dark current of the sample of Comparative Example 1.

Next, the above stack was immersed in acetone under a nitrogen atmosphere, whereby the mixture film, which served as a photoelectric conversion layer, was wet etched. After 5 minutes elapsed, the stack was taken out of acetone, which was used as an etchant, whereby the sample of Example 1 was obtained.

Figure 22:
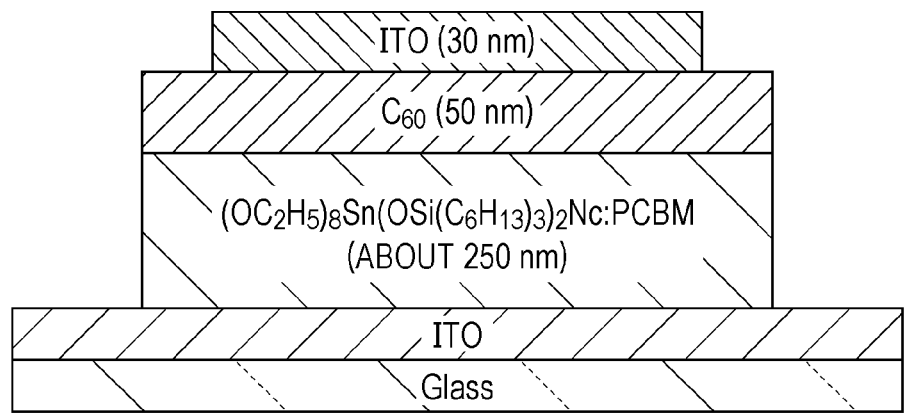
FIG. 22 is a schematic sectional view showing the configuration of an etched stack.

FIG. 22 schematically shows the configuration of the etched stack. As schematically shown in FIG. 22, in the sample of Example 1, a portion not covered by the $C_{60}$ layer was removed from the mixture film by wet etching. The etching rate of the mixture film in this operation was 50 nm/min. Incidentally, $C_{60}$ is insoluble in acetone. The etching rate of the $C_{60}$ layer may be considered as 0 nm/min.

The current density induced between the upper electrode and lower electrode of the sample of Example 1 was measured under a nitrogen atmosphere in substantially the same manner as that used in Comparative Example 1, whereby a value of $7.5 \times 10^{-5}$ mA/cm$^2$ was obtained.

Example 2 and Comparative Example 2

First, a stack having a configuration that was substantially the same as the configuration shown in FIG. 21 was prepared in substantially the same manner as that used to prepare the sample of Comparative Example 1. Next, the current density induced between an upper electrode and a lower electrode was measured under a nitrogen atmosphere in substantially the same manner as that used in Comparative Example 1, whereby a value of $1.0 \times 10^{-4}$ mA/cm$^2$ was obtained. The measurement obtained in this operation was defined as the dark current of a sample of Comparative Example 2.

Next, the stack was immersed in a mixture of acetone and ethanol under a nitrogen atmosphere, so that a mixture film serving as a photoelectric conversion layer was wet etched, whereby a stack having a configuration that was substantially the same as the configuration shown in FIG. 22 was prepared. The ratio of acetone to ethanol in the mixture used in this operation was 3:1 on a volume basis. After this stack was immersed in the mixture for 6 minutes, this stack was taken out of the mixture, which was used as an etchant, whereby a sample of Example 2 was obtained. The etching rate of the mixture film was 40 nm/min. The current density induced between the upper electrode and the lower electrode was measured under a nitrogen atmosphere in substantially the same manner as that used in Example 1 and Comparative Examples 1 and 2, whereby a measurement of $1.6 \times 10^{-5}$ mA/cm$^2$, which was the magnitude of a dark current, was obtained.

Example 3 and Comparative Example 3

A stack having a configuration that was substantially the same as the configuration shown in FIG. 21 was prepared in substantially the same manner as that used to prepare the samples of Comparative Examples 1 and 2. Next, the current density induced between an upper electrode and a lower electrode was measured under a nitrogen atmosphere in substantially the same manner as that used in Comparative Examples 1 and 2, whereby a measurement of $3.5 \times 10^{-3}$ mA/cm$^2$, which was the magnitude of a dark current, was obtained. The measurement obtained in this operation was defined as the dark current of a sample of Comparative Example 3.

A mixture film was selectively wet etched in substantially the same manner as that used to prepare the sample of Example 2 except that a mixture with an acetone-to-ethanol volume ratio of 2:1 was used as an etchant and the immersion time of the stack was 8 minutes, whereby a sample of Example 3 was prepared. The etching rate of the mixture film was 30 nm/min. The current density induced between the upper electrode and the lower electrode was measured under a nitrogen atmosphere in substantially the same manner as that used in each of the above examples, whereby a measurement of $2.5 \times 10^{-4}$ mA/cm$^2$, which was the magnitude of a dark current, was obtained.

Example 4 and Comparative Example 4

A stack having a configuration that was substantially the same as the configuration shown in FIG. 21 was prepared in substantially the same manner as that used to prepare the samples of Comparative Examples 1 to 3. Next, the current density induced between an upper electrode and a lower electrode was measured under a nitrogen atmosphere in substantially the same manner as that used in Comparative Examples 1, 2, and 3, whereby a measurement of $4.2 \times 10^{-5}$ mA/cm$^2$, which was the magnitude of a dark current, was obtained. The measurement obtained in this operation was defined as the dark current of a sample of Comparative Example 4.

A mixture film was selectively wet etched in substantially the same manner as that used to prepare the samples of Examples 2 and 3 except that a mixture with an acetone-to-ethanol volume ratio of 1:1 was used as an etchant and the immersion of the stack was 12.5 minutes, whereby a sample of Example 4 was prepared. The etching rate of the mixture film was 20 nm/min. The current density induced between the upper electrode and the lower electrode was measured under a nitrogen atmosphere in substantially the same manner as that used in the above examples, whereby a measurement of $1.9 \times 10^{-5}$ mA/cm$^2$, which was the magnitude of a dark current, was obtained.

The table below shows the dark current measured for the sample of each of Examples 1 to 4 and Comparative Examples 1 to 4.

TABLE

| | Acetone to ethanol (volume ratio) | Etching rate [nm/min.] | Immersion time [min.] | Dark current [mA/cm$^2$] @ 5 V |
|---|---|---|---|---|
| Comparative Example 1 | 1:0 | 50 | | $2.3 \times 10^{-4}$ |
| Example 1 | | | 5 | $7.5 \times 10^{-5}$ |
| Comparative Example 2 | 3:1 | 40 | | $1.0 \times 10^{-4}$ |
| Example 2 | | | 6 | $1.6 \times 10^{-5}$ |
| Comparative Example 3 | 2:1 | 30 | | $3.5 \times 10^{-3}$ |
| Example 3 | | | 8 | $2.5 \times 10^{-4}$ |
| Comparative Example 4 | 1:1 | 20 | | $4.2 \times 10^{-5}$ |
| Example 4 | | | 12.5 | $1.9 \times 10^{-5}$ |

From the table, it became clear that, although the dark current measured for the samples of Comparative Examples 1 to 4 varied to a certain extent, the value of the dark current was reduced by wet etching every sample with reference to the dark current measured for the samples of corresponding examples. That is, it became clear that the value of the dark current was reduced by wet-etching a photoelectric conversion film and the effect of suppressing a white defect was obtained. It is inferred that the reduction in value of the dark current occurred because the stress in a mixture film was reduced by wet etching. This suggests the possibility that molecules in a photoelectric conversion film are likely to move in such a state that a structure including the photoelectric conversion film is immersed in an etchant and the molecules are rearranged in a stable state in the course of pulling up the structure from the etchant and drying the structure. There is a possibility that the etchant partially permeated the photoelectric conversion film.

It can be said that Examples 1 to 4 described above correspond to the case where a $C_{60}$ layer that is an organic layer with an etching rate lower than that of a mixture film serving as a photoelectric conversion film is used as an etching mask. In the case where an ITO film serving as an upper electrode is used as an etching mask and in the case where an oxide semiconductor material is used to form a hole-blocking layer instead of $C_{60}$, a similar effect can be expected to be obtained. According to an embodiment of the present disclosure, the reduction of the stress occurring at the interface between a photoelectric conversion film and another member and the partial removal of the photoelectric conversion film by etching can be achieved at the same time.

What is claimed is:

1. A photoelectric conversion element comprising:
    a semiconductor substrate having a principal surface;
    second electrodes which are located on or above the principal surface, the second electrodes being one- or two-dimensionally arranged;
    a photoelectric conversion film covering at least the second electrodes; and
    a conductive layer that includes a covering section covering a portion of the photoelectric conversion film, the portion overlapping the second electrodes in plan view, wherein
        in a cross section perpendicular to the principal surface, the conductive layer includes an overhanging portion that overhangs a side end portion of the photoelectric conversion film,
        in the cross section, an outwardly facing surface of the photoelectric conversion film below the overhanging portion of the conductive layer includes a tapered portion, the tapered portion being located on an outermost side of the photoelectric conversion film, and
        in the cross section, a width of the photoelectric conversion film increases toward the principal surface.

2. The photoelectric conversion element according to claim 1, wherein the conductive layer is made of an organic material.

3. The photoelectric conversion element according to claim 2, wherein the organic material is a photoelectric conversion material.

4. The photoelectric conversion element according to claim 1, wherein the conductive layer is made of an oxide semiconductor material.

5. The photoelectric conversion element according to claim 1, further comprising:
    a first electrode located on or above the principal surface; and
    a light-transmissive third electrode which covers the covering section and which electrically connects the covering section to the first electrode.

6. The photoelectric conversion element according to claim 1, wherein the conductive layer is made of a transparent conductive material.

7. The photoelectric conversion element according to claim 1, further comprising:
    a first electrode located on or above the principal surface; and
    a third electrode electrically connecting the covering section to the first electrode.

8. The photoelectric conversion element according to claim 1, wherein the semiconductor substrate includes at least a part of a readout circuit electrically connected to the second electrodes.

9. The photoelectric conversion element according to claim 1, wherein the conductive layer is not in direct contact with the tapered portion.

10. The photoelectric conversion element according to claim 1, wherein the second electrodes are in direct contact with the principal surface.

11. The photoelectric conversion element according to claim 1, wherein an entire top surface of the photoelectric conversion film is flat.

12. The photoelectric conversion element according to claim 1, wherein an entire bottom surface of the photoelectric conversion film is flat.

13. The photoelectric conversion element according to claim 1, wherein
    at least part of a bottom surface of the photoelectric conversion film is flat, and
    the at least part of the bottom surface of the photoelectric conversion film covers the second electrodes.

14. The photoelectric conversion element according to claim 1, wherein
    at least part of a top surface of the photoelectric conversion film is flat, and
    the at least part of the top surface of the photoelectric conversion film covers the second electrodes.

* * * * *